(12) United States Patent
Iwahori

(10) Patent No.: US 11,398,466 B2
(45) Date of Patent: Jul. 26, 2022

(54) SEMICONDUCTOR INTEGRATED CIRCUIT DEVICE

(71) Applicant: SOCIONEXT INC., Kanagawa (JP)

(72) Inventor: Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/918,852

(22) Filed: Jul. 1, 2020

(65) Prior Publication Data

US 2020/0335488 A1 Oct. 22, 2020

Related U.S. Application Data

(63) Continuation of application No. PCT/JP2018/000678, filed on Jan. 12, 2018.

(51) Int. Cl.
| | | |
|---|---|---|
| *H01L 27/02* | (2006.01) | |
| *H01L 23/528* | (2006.01) | |
| *H01L 27/092* | (2006.01) | |
| *H01L 29/06* | (2006.01) | |
| *H01L 29/78* | (2006.01) | |

(52) U.S. Cl.
CPC ...... *H01L 27/0207* (2013.01); *H01L 23/5286* (2013.01); *H01L 27/092* (2013.01); *H01L 29/0676* (2013.01); *H01L 29/7827* (2013.01)

(58) Field of Classification Search
CPC ............. H01L 27/0207; H01L 23/5286; H01L 27/092; H01L 29/0676; H01L 29/7827; H01L 29/775; H01L 2027/11842; H01L 28/90; H01L 21/823487; H01L 27/088; H01L 27/0629; H01L 21/823885; H01L 21/823871; B82Y 10/00
See application file for complete search history.

(56) References Cited

U.S. PATENT DOCUMENTS

| | | | | |
|---|---|---|---|---|
| 2010/0044755 | A1* | 2/2010 | Tsuda | H01L 27/11898 257/206 |
| 2016/0063163 | A1* | 3/2016 | Moroz | H01L 27/0207 716/110 |
| 2017/0179134 | A1* | 6/2017 | Liaw | H01L 27/1104 |
| 2019/0074297 | A1* | 3/2019 | Kishishita | H01L 29/0649 |

FOREIGN PATENT DOCUMENTS

| | | |
|---|---|---|
| JP | 2008-263185 A | 10/2008 |
| JP | 2010-074125 A | 4/2010 |
| JP | 2012-222065 A | 11/2012 |
| WO | 2017/191799 A1 | 11/2017 |

OTHER PUBLICATIONS

International Search Report and Written Opinion issued in corresponding International Patent Application No. PCT/JP2018/000678, dated Mar. 30, 2018, with partial English translation.

* cited by examiner

*Primary Examiner* — Edward Chin
(74) *Attorney, Agent, or Firm* — McDermott Will & Emery LLP

(57) ABSTRACT

A layout structure of a capacitance cell using vertical nanowire (VNW) FETs is provided. The capacitance cell includes a plurality of first-conductivity type VNW FETs lining up in the X direction, provided between a first power supply interconnect and a second power supply interconnect. The plurality of first-conductivity type VNW FETs include at least one first VNW FET having a top and a bottom connected with the first power supply interconnect and a gate connected with the second power supply interconnect.

11 Claims, 26 Drawing Sheets

FIG.1
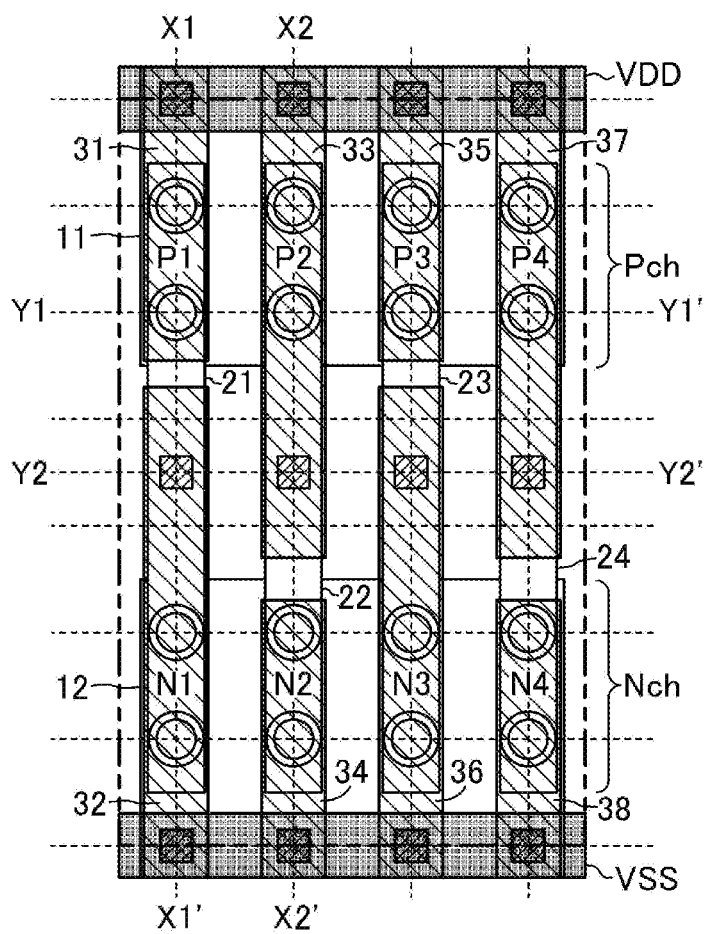
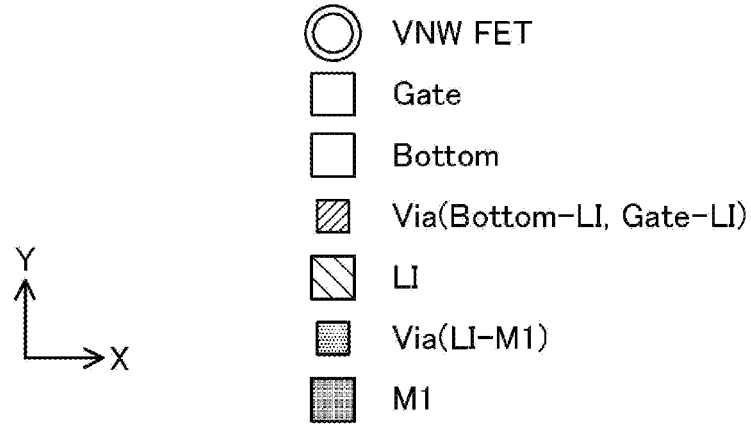

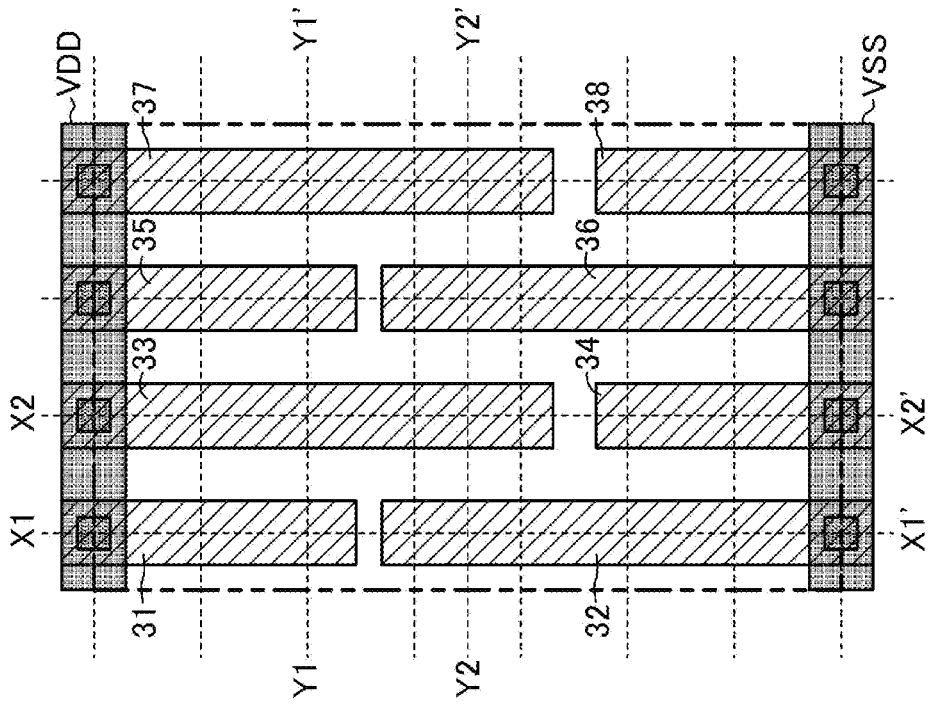
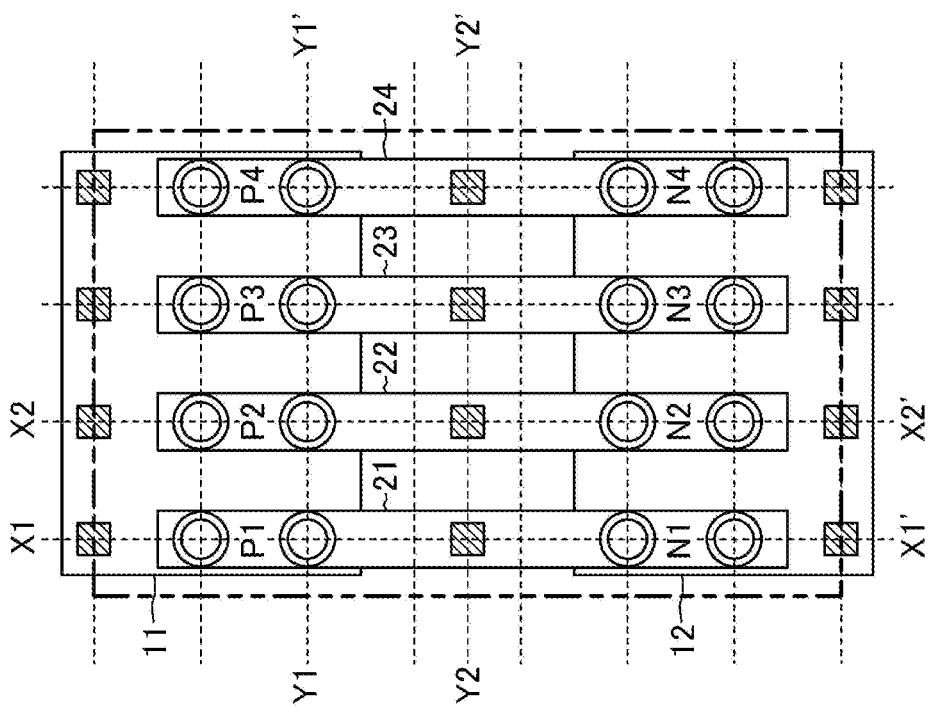

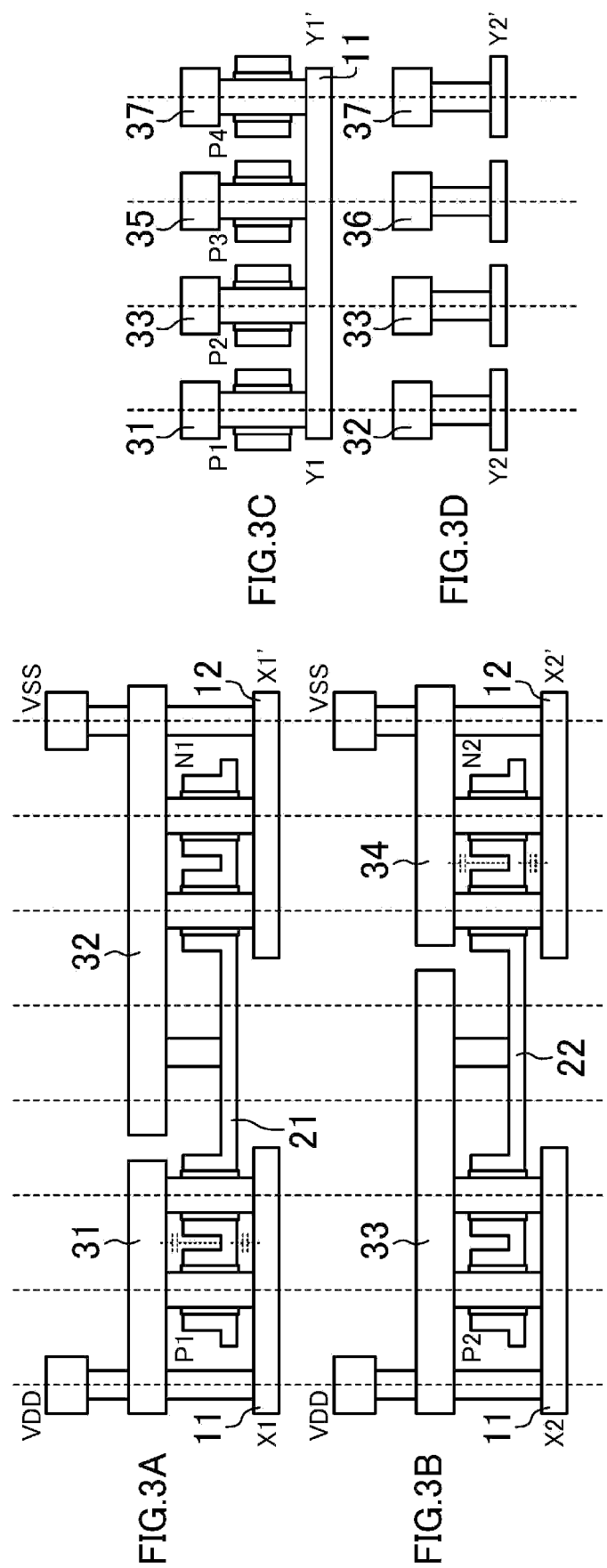

FIG.5
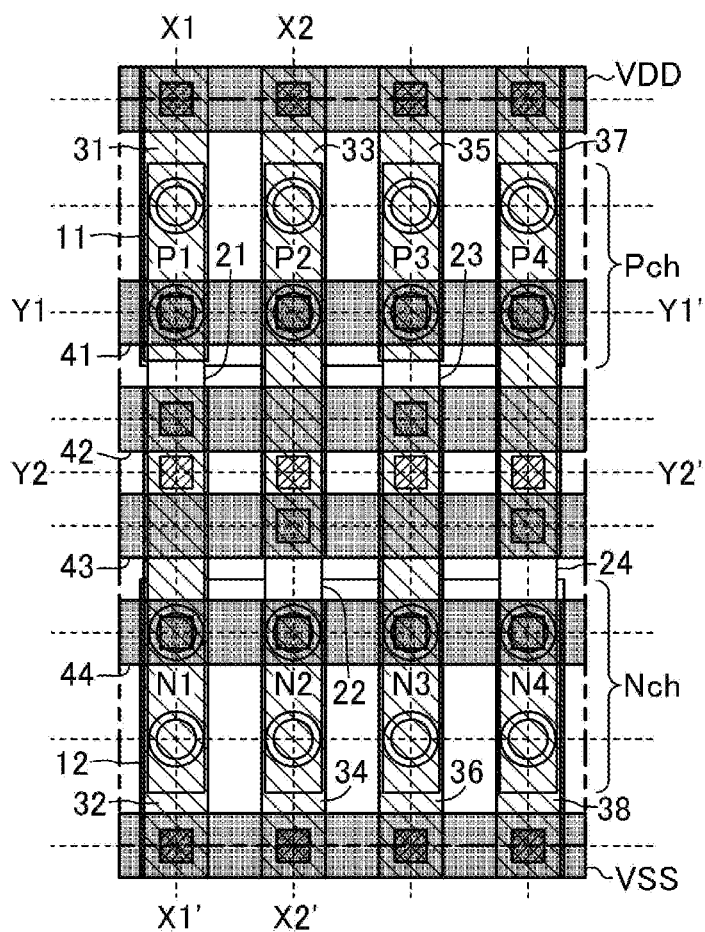
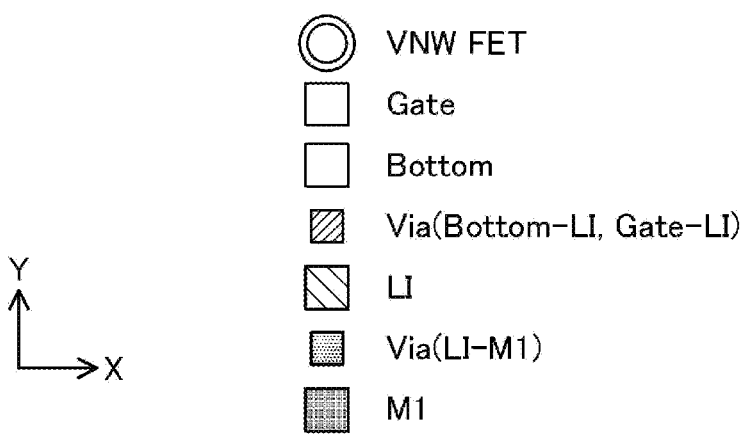

FIG.6
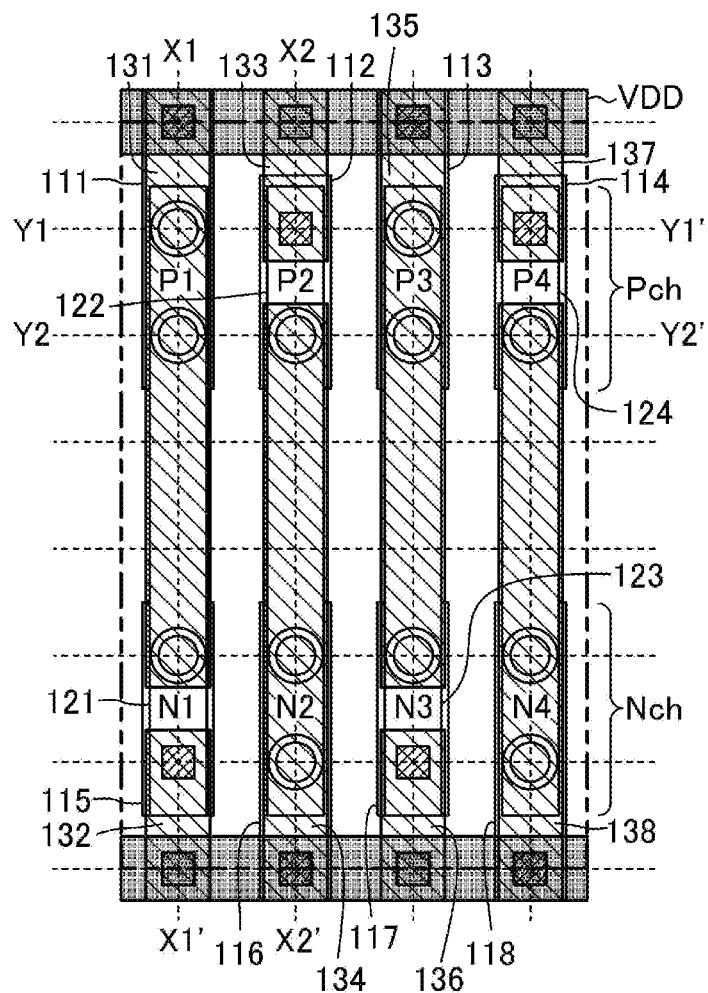
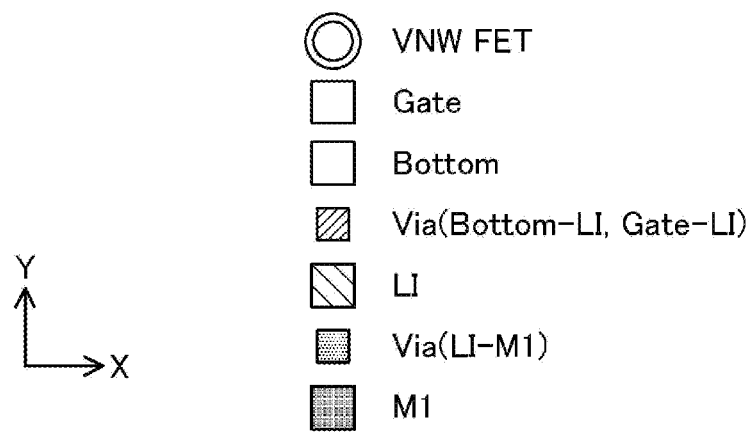

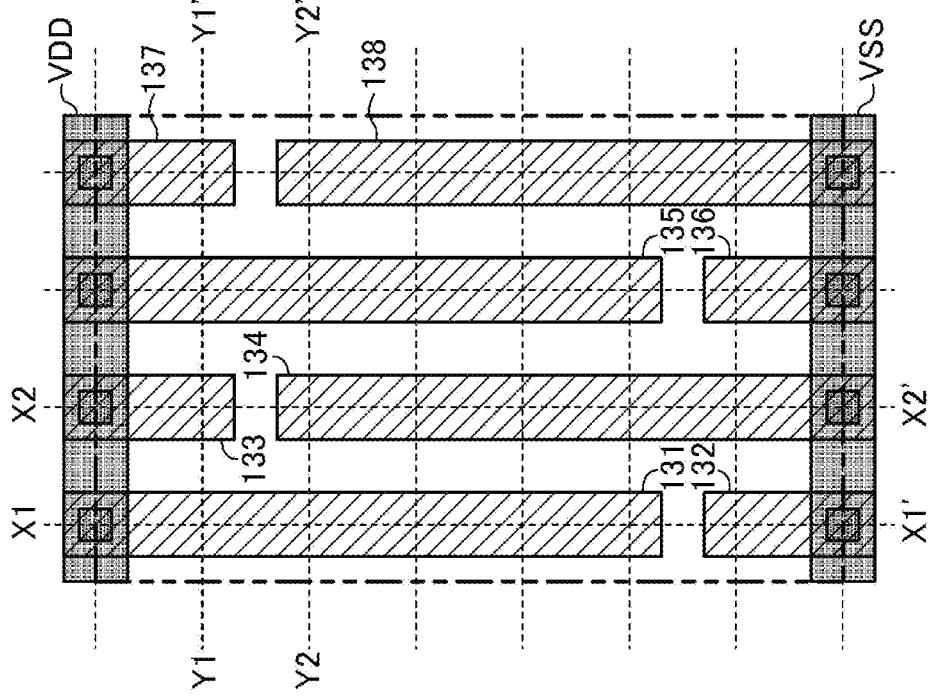
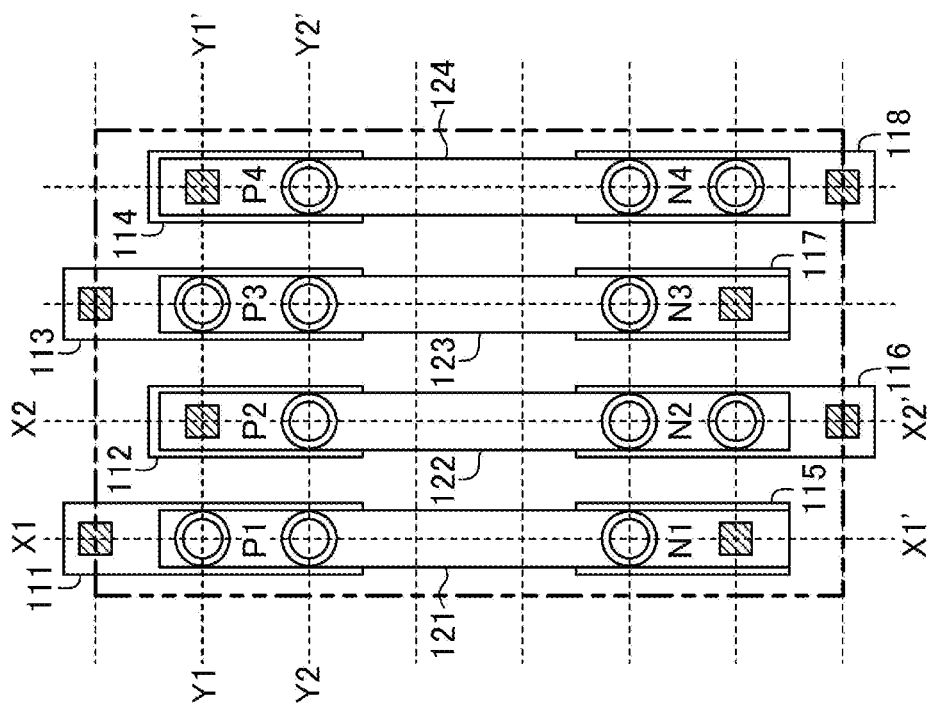

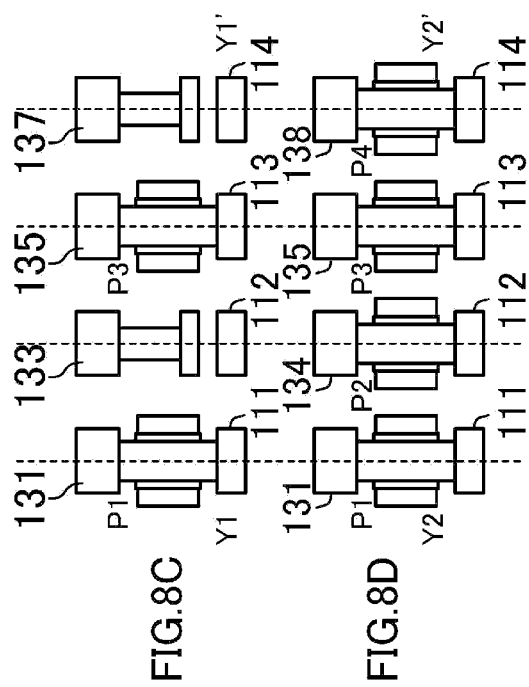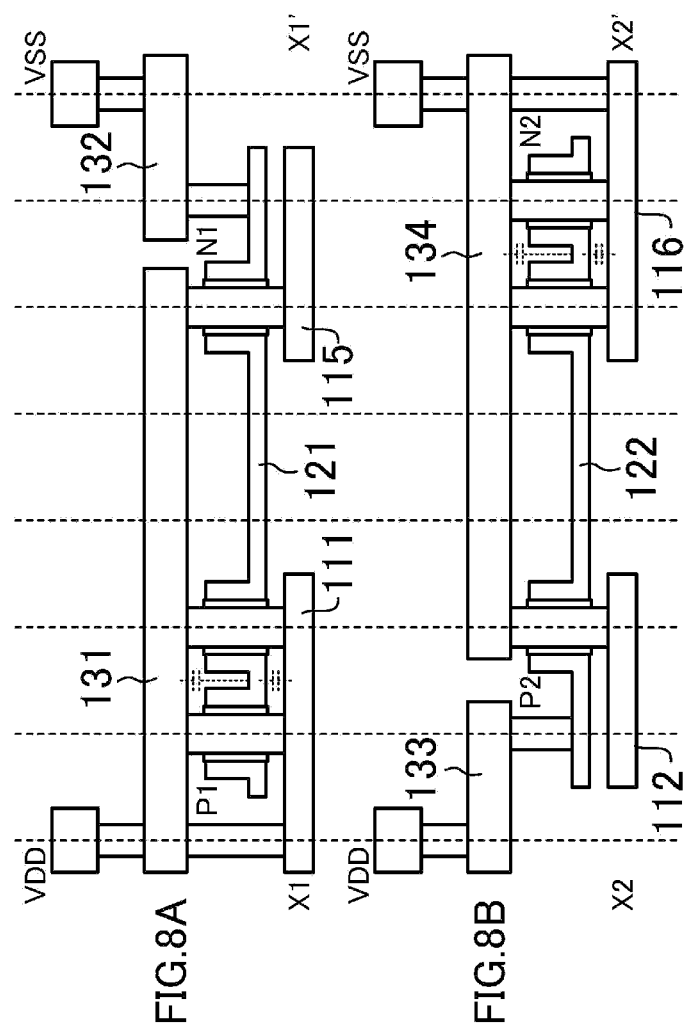

FIG.10
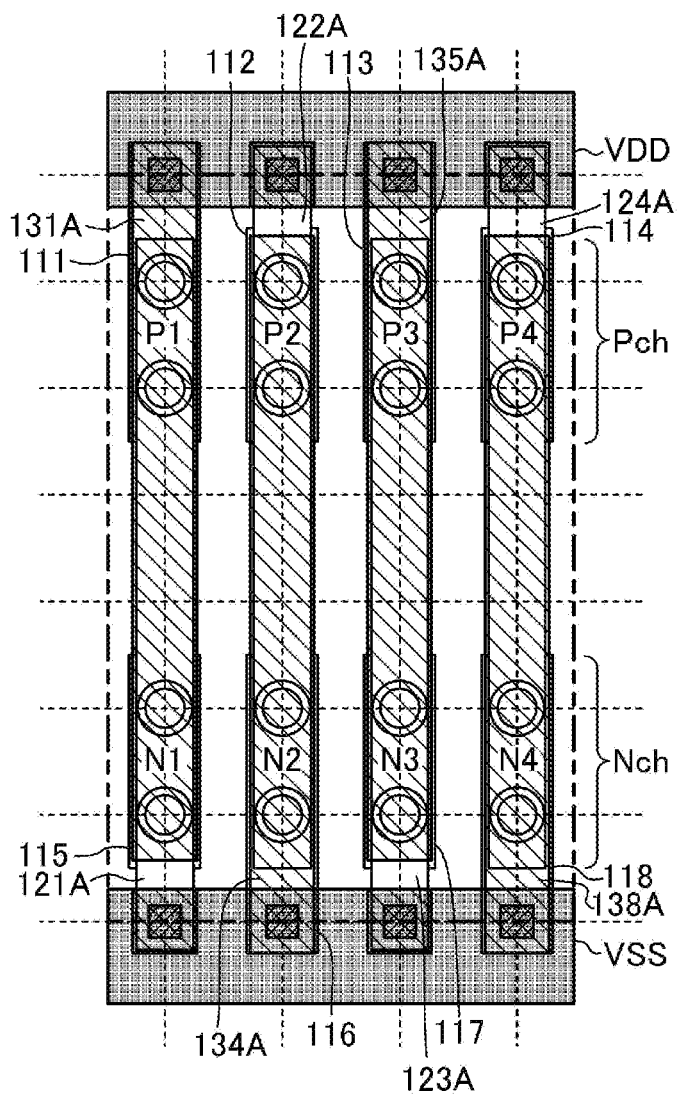
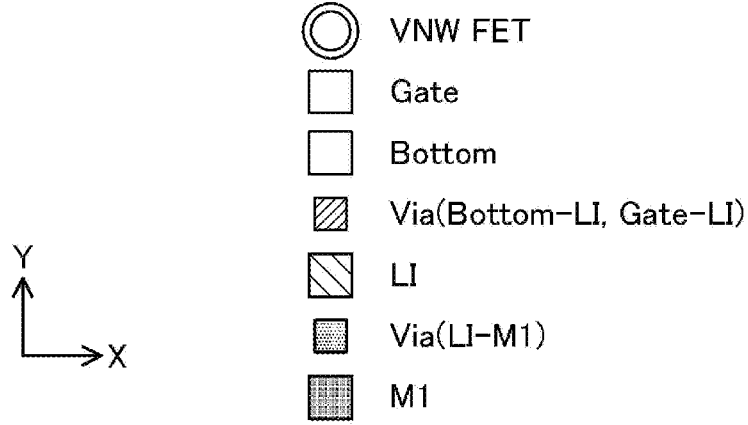

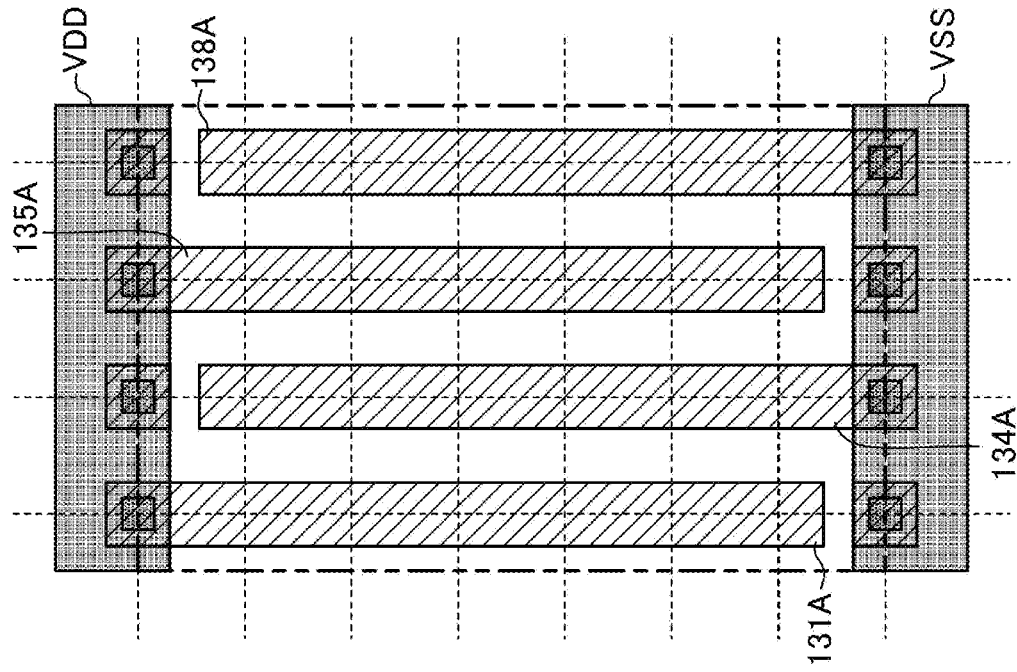
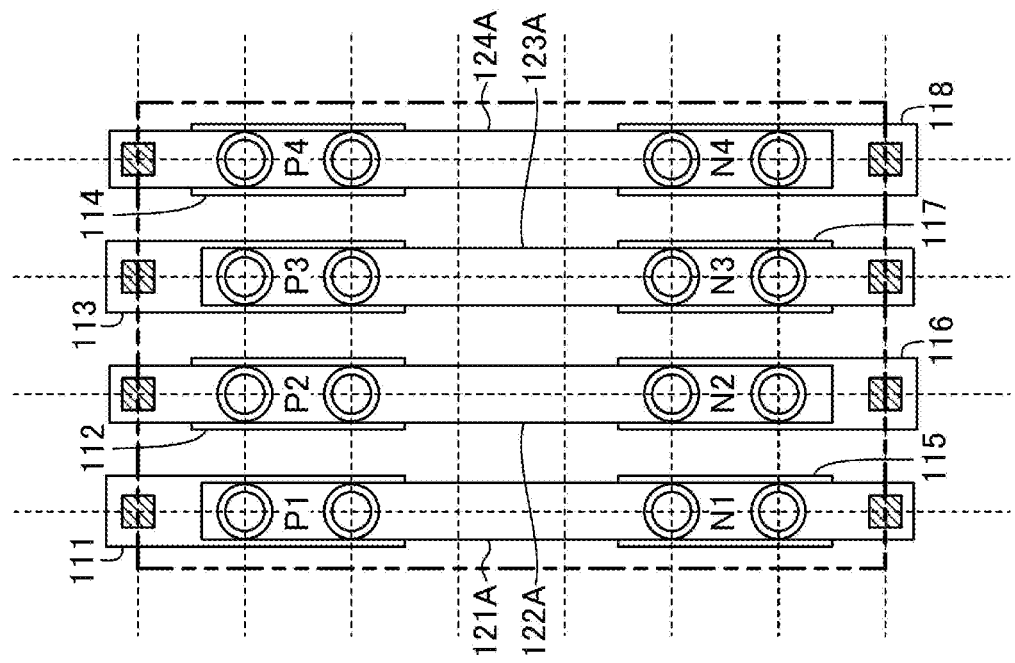

FIG.13
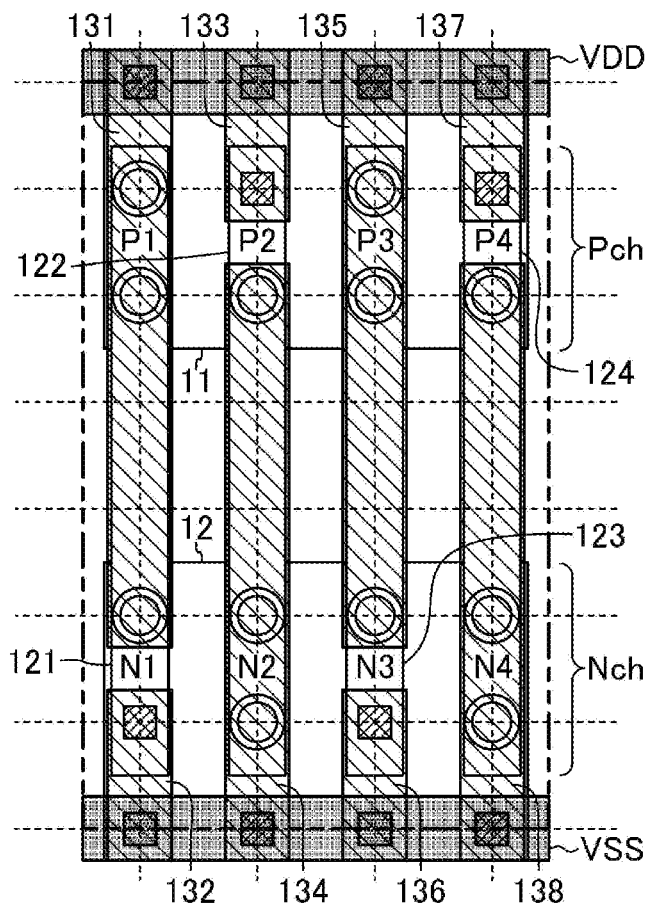
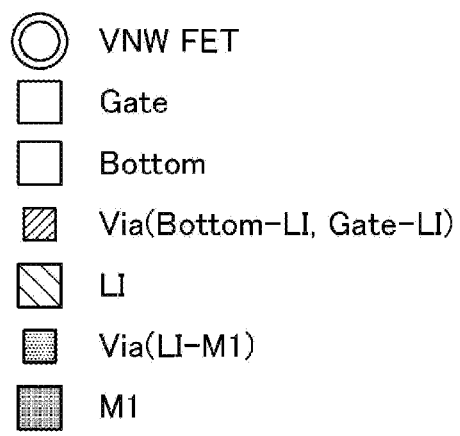

FIG.14
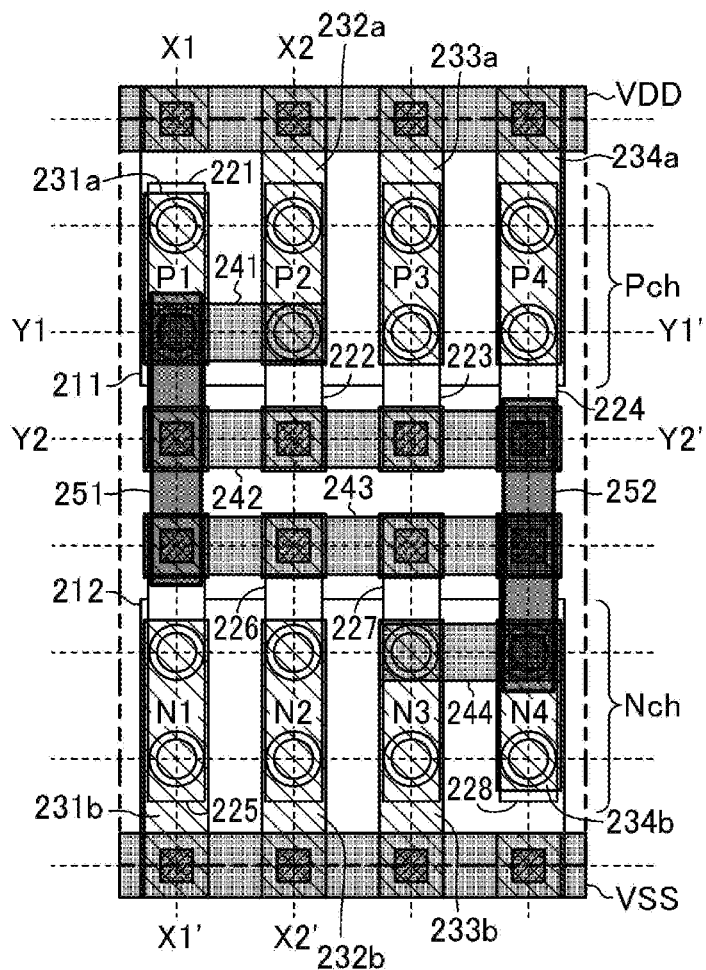
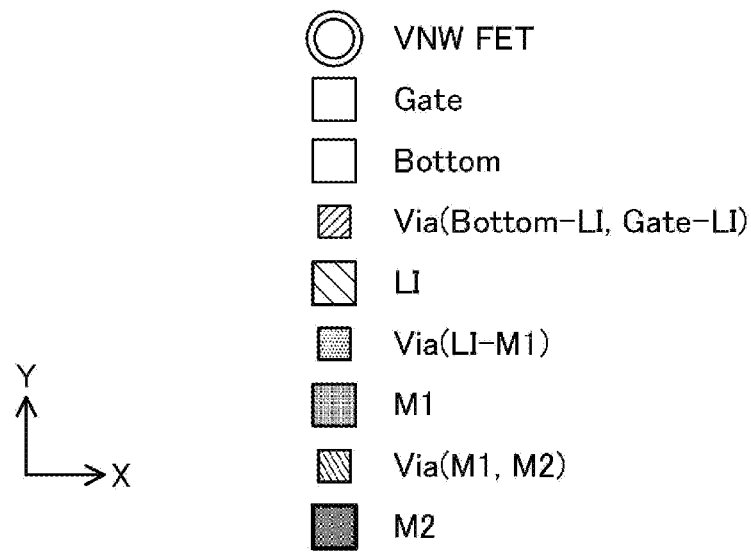

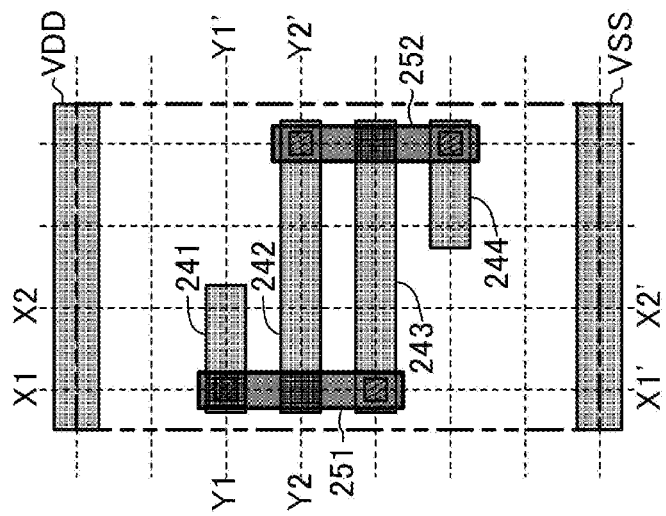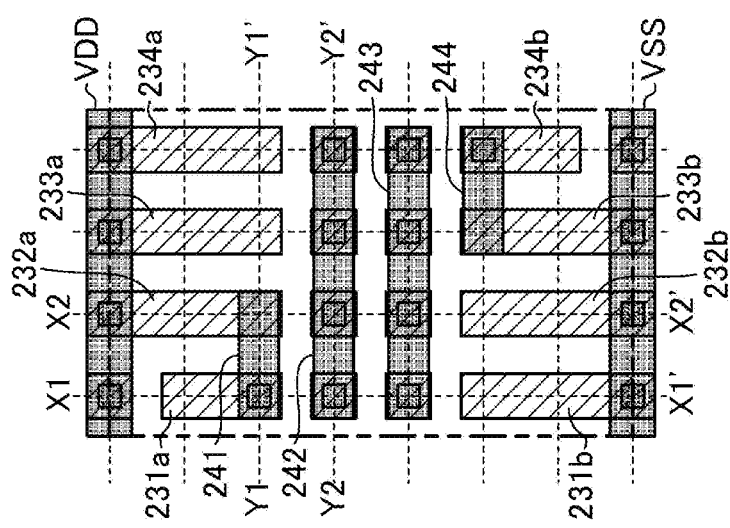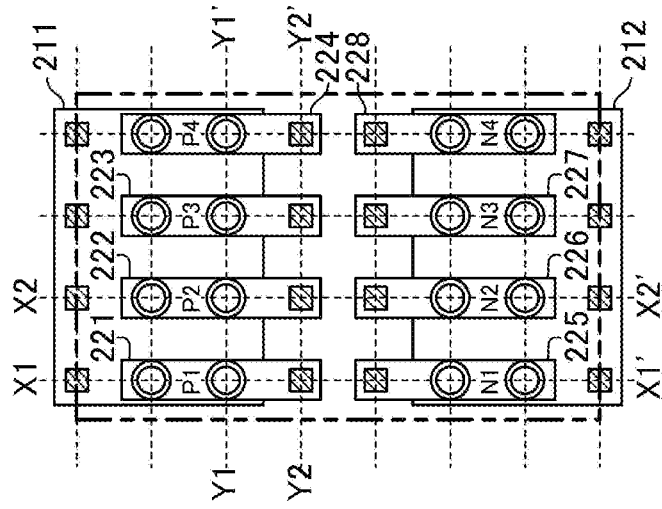

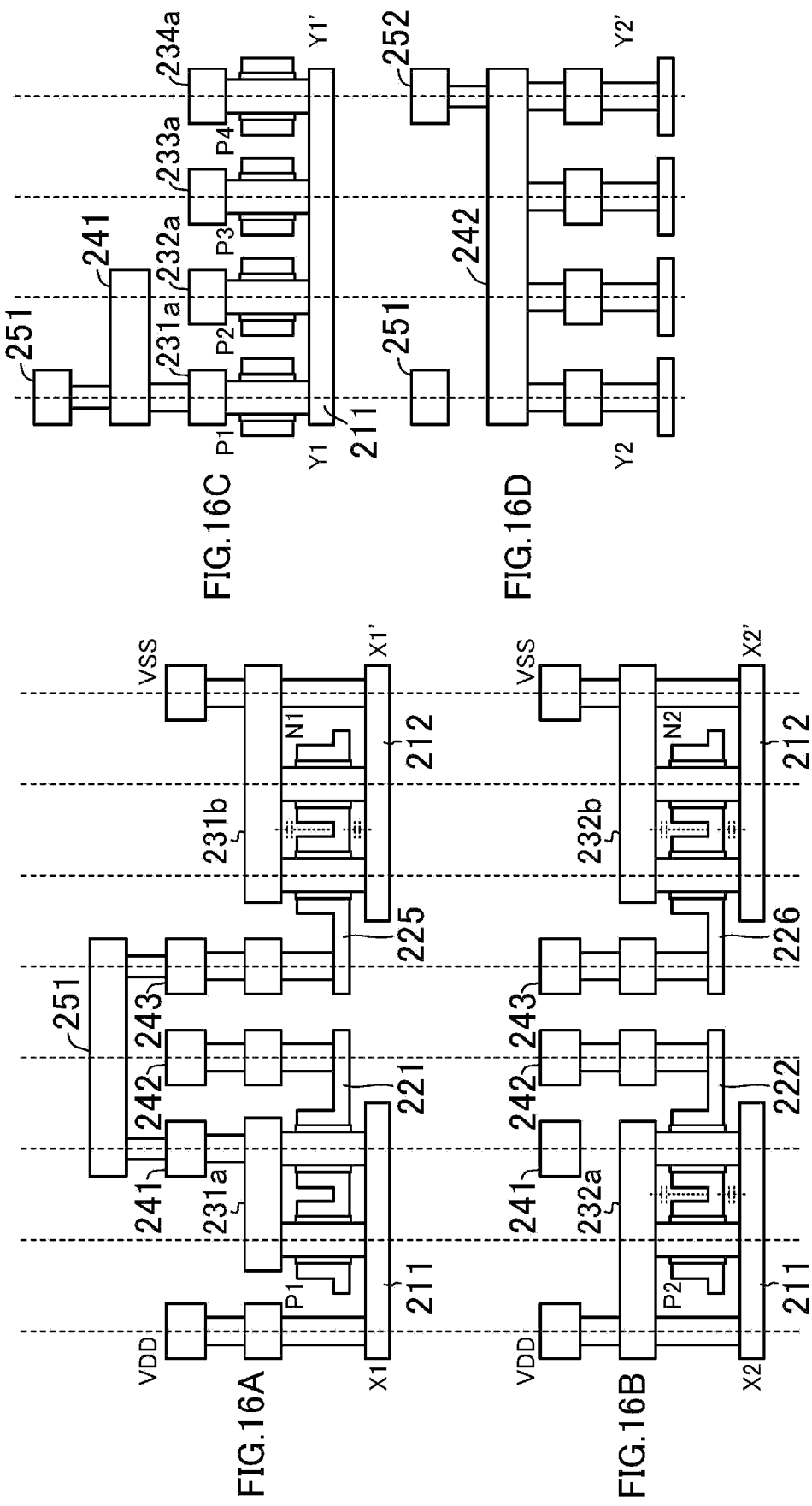

FIG.18
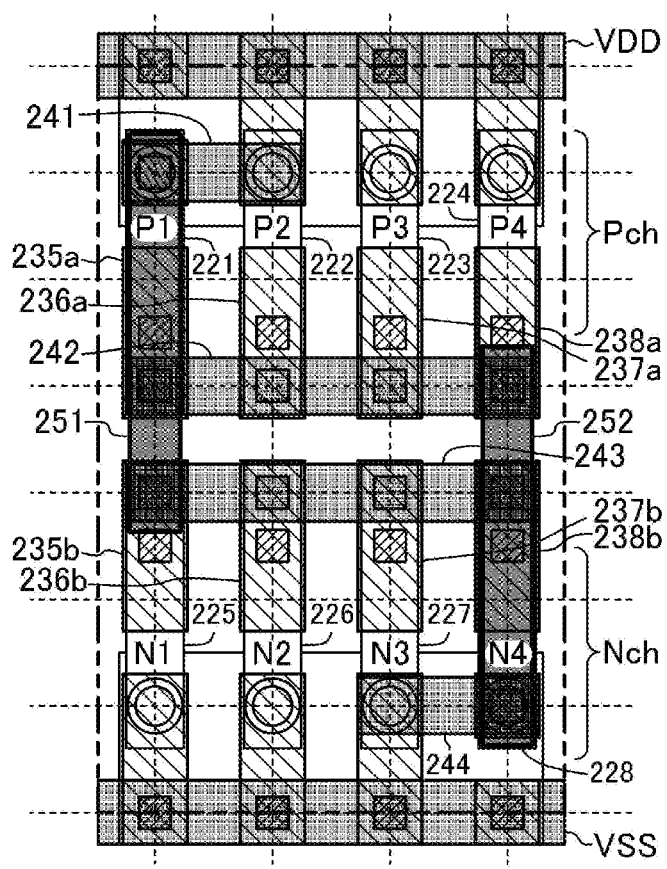
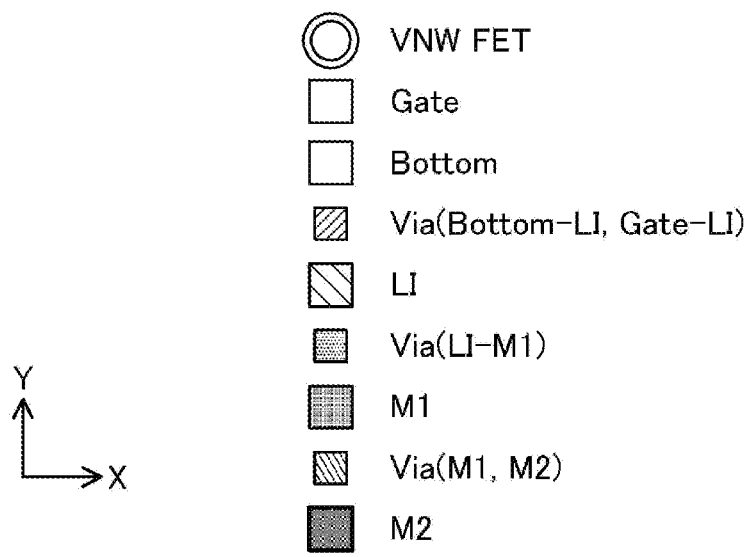

FIG.22
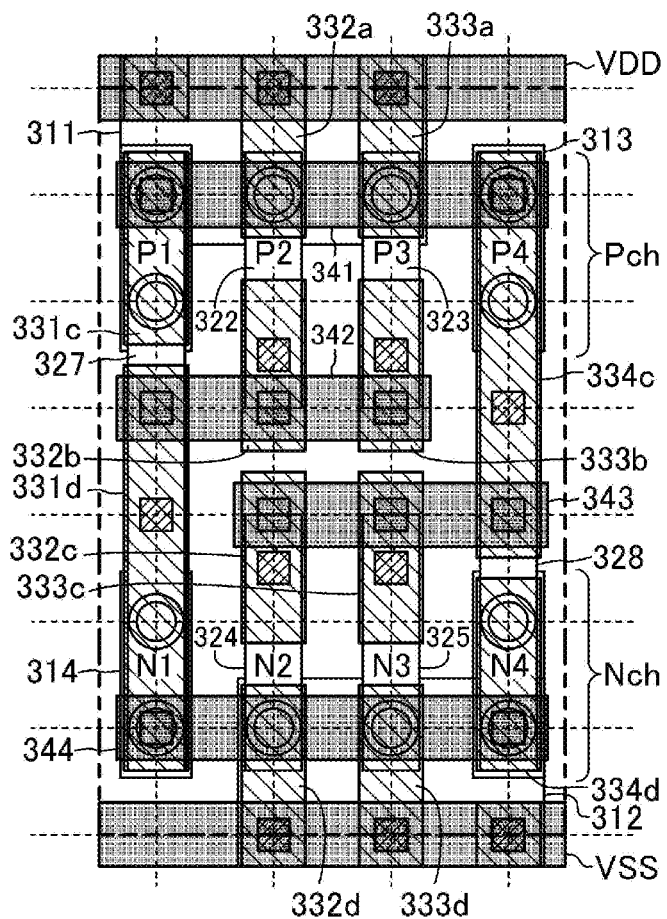
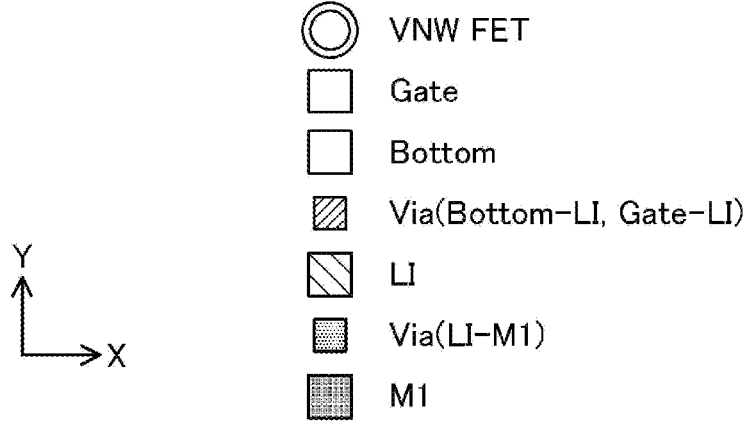

SEMICONDUCTOR INTEGRATED CIRCUIT DEVICE

CROSS-REFERENCE TO RELATED APPLICATIONS

This is a continuation of International Application No. PCT/JP2018/000678 filed on Jan. 12, 2018. The entire disclosure of this application is incorporated by reference herein.

BACKGROUND

The present disclosure relates to a semiconductor integrated circuit device provided with standard cells each including vertical nanowire (VNW) field effect transistors (FETs).

A standard cell method is known as a method of forming a semiconductor integrated circuit on a semiconductor substrate. The standard cell method is a method in which basic units (e.g., inverters, latches, flipflops, and full adders) having specific logical functions are prepared in advance as standard cells, a plurality of standard cells are placed on a semiconductor substrate, and such standard cells are connected with interconnects, thereby designing an LSI chip.

Regarding transistors as basic constituents of an LSI, improvement in integration degree, reduction in operating voltage, and improvement in operating speed have been achieved thanks to the scaling of the gate length. Recently, however, an increase in off current due to excessive scaling and the resulting significant increase in power consumption have raised a problem. To solve this problem, three-dimensional transistors having a three-dimensional structure changed from the conventional planar structure have been vigorously studied. As one type of such transistors, a vertical nanowire FET (hereinafter referred to as a VNW FET as appropriate) has attracted attention.

Also, the recent progress toward finer sizes and higher integration in semiconductor integrated circuits is prominent, and, in association with this, trends toward a lower operating voltage and a higher operating frequency have been accelerated. However, since noise increases with a higher operating frequency, and noise immunity decreases with a lower voltage, there arises a problem that a noise-caused malfunction of a circuit easily occurs in recent semiconductor integrated circuits. As a method for preventing a noise-caused circuit malfunction, a decoupling capacitance may be provided between power supplies of a circuit. A cell in which such a decoupling capacitance is formed is called a capacitance cell.

Japanese Unexamined Patent Publication No. 2012-222065 discloses a layout of a capacitance cell.

SUMMARY

As of today, however, no study has been made on a capacitance cell using VNW FETs.

An objective of the present disclosure is providing a layout structure, for a capacitance cell using VNW FETs, capable of sufficiently securing a capacitance value.

In the first mode of the present disclosure, a semiconductor integrated circuit device includes a standard cell that is a capacitance cell, wherein the standard cell includes a first power supply interconnect extending in a first direction, configured to supply a first power supply voltage, a second power supply interconnect extending in the first direction, configured to supply a second power supply voltage different from the first power supply voltage, and a plurality of first-conductivity type vertical nanowire (VNW) FETs lining up in the first direction, provided between the first power supply interconnect and the second power supply interconnect, and the plurality of first-conductivity type VNW FETs include at least one first VNW FET having a top and a bottom connected with the first power supply interconnect and a gate connected with the second power supply interconnect.

According to the above mode, in the standard cell that is a capacitance cell, a plurality of first-conductivity type VNW FETs lining up in the first direction are provided between the first power supply interconnect and the second power supply interconnect. At least one first VNW FET included in the plurality of first-conductivity type VNW FETs has a top and a bottom to which the first power supply voltage is supplied and a gate to which the second power supply voltage is supplied. Therefore, the first VNW FET is ON, whereby a decoupling capacitance between the power supplies through a gate oxide film is formed.

In the second mode of the present disclosure, a semiconductor integrated circuit device includes a standard cell that is a capacitance cell, wherein the standard cell includes a first power supply interconnect extending in a first direction, configured to supply a first power supply voltage, a second power supply interconnect extending in the first direction, configured to supply a second power supply voltage different from the first power supply voltage, a first capacitance part having a plurality of first-conductivity type vertical nanowire (VNW) FETs lining up in the first direction, provided between the first power supply interconnect and the second power supply interconnect, and a fixed value output part having a second-conductivity type VNW FET provided between the first power supply interconnect and the second power supply interconnect, configured to supply the second power supply voltage to the first capacitance part, and the plurality of first-conductivity type VNW FETs of the first capacitance part include at least one first VNW FET having a top and a bottom connected with the first power supply interconnect and a gate connected with a top of the second-conductivity type VNW FET of the fixed value output part.

According to the above mode, the standard cell that is a capacitance cell includes a first capacitance part having a plurality of first-conductivity type VNW FETs lining up in the first direction, provided between the first power supply interconnect and the second power supply interconnect, and a fixed value output part having a second-conductivity type VNW FET provided between the first power supply interconnect and the second power supply interconnect and supplying the second power supply voltage to the capacitance part. At least one first VNW FET included in the plurality of first-conductivity type VNW FETs of the first capacitance part has a top and a bottom to which the first power supply voltage is supplied and a gate to which the second power supply voltage is supplied from the top of the second-conductivity type VNW FET of the fixed value output part. Therefore, the first VNW FET is ON, whereby a decoupling capacitance between the power supplies through a gate oxide film is formed.

According to the present disclosure, a layout structure capable of sufficiently securing a capacitance value can be achieved for a capacitance cell using VNW FETs.

BRIEF DESCRIPTION OF THE DRAWINGS

FIG. 1 is a plan view showing an example of the layout structure of a capacitance cell according to the first embodiment.

FIGS. 2A and 2B are plan views in different layers showing the layout structure of the capacitance cell according to the first embodiment.

FIGS. 3A to 3D are cross-sectional views showing the layout structure of the capacitance cell according to the first embodiment.

FIG. 5 is a plan view showing an example of the layout structure of a capacitance cell according to an alteration of the first embodiment.

FIG. 6 is a plan view showing an example of the layout structure of a capacitance cell according to the second embodiment.

FIGS. 7A and 7B are plan views in different layers showing the layout structure of the capacitance cell according to the second embodiment.

FIGS. 8A to 8D are cross-sectional views showing the layout structure of the capacitance cell according to the second embodiment.

FIG. 10 is a plan view showing an example of the layout structure of a capacitance cell of Alteration 1 of the second embodiment.

FIGS. 11A and 11B are plan views in different layers showing the layout structure of the capacitance cell according to Alteration 1 of the second embodiment.

FIG. 13 is a plan view showing an example of the layout structure of a capacitance cell according to Alteration 2 of the second embodiment.

FIG. 14 is a plan view showing an example of the layout structure of a capacitance cell according to the third embodiment.

FIGS. 15A to 15C are plan views in different layers showing the layout structure of the capacitance cell according to the third embodiment.

FIGS. 16A to 16D are cross-sectional views showing the layout structure of the capacitance cell according to the third embodiment.

FIG. 18 is a plan view showing an example of the layout structure of a capacitance cell according to an alteration of the third embodiment.

FIG. 22 is a plan view showing an example of the layout structure of a capacitance cell according to an alteration of the fourth embodiment.

FIG. 25A is a cross-sectional view and FIG. 25B is a plan view.

DETAILED DESCRIPTION

Embodiments of the present disclosure will be described hereinafter with reference to the accompanying drawings. In the following embodiments, it is assumed that a semiconductor integrated circuit device includes a plurality of standard cells, and that at least some of the plurality of standard cells include so-called vertical nanowire FETs (VNW FETs). It is also assumed that the plurality of standard cells include a capacitance cell using VNW FETs.

Figure 25A:
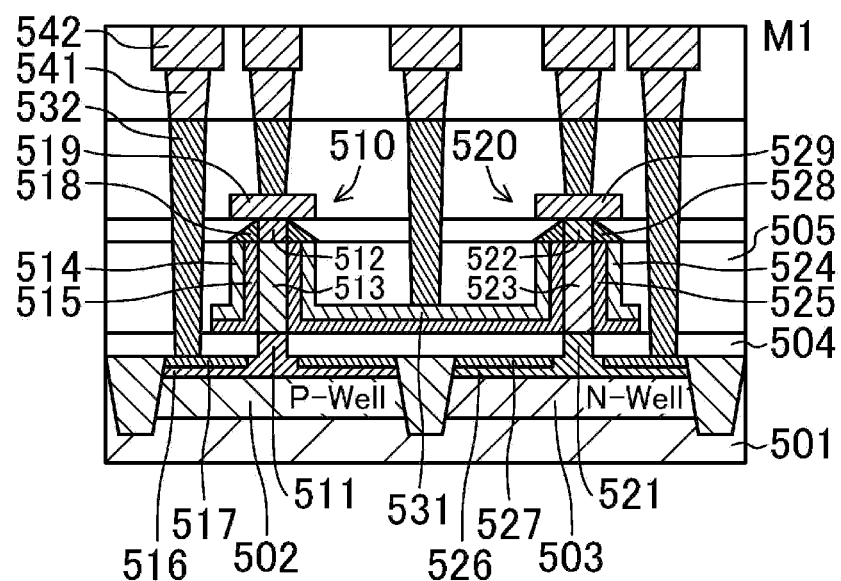
FIGS. 25A and 25B are schematic views showing a basic structure example of vertical nanowire FETs, where
Figure 25B:
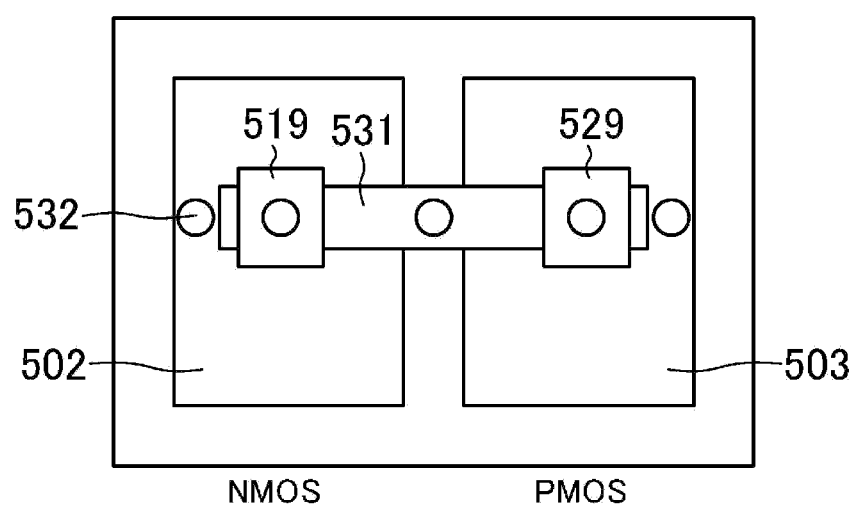

FIGS. 25A and 25B are schematic views showing a basic structure example of VNW FETs, where FIG. 25A is a cross-sectional view and FIG. 25B is a plan view. Note that, in FIG. 25B, illustration of metal interconnects is omitted and, for easy understanding, constituents invisible when actually viewed from top are illustrated.

As shown in FIGS. 25A and 25B, a p-well 502 and an n-well 503 are formed on a semiconductor substrate 501. Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note that the sidewall 518 and the silicide region 519 may not be formed.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note that the sidewall 528 and the silicide region 529 may not be formed.

In the structure of FIGS. 25A and 25B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, $BF_2$, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 26A:
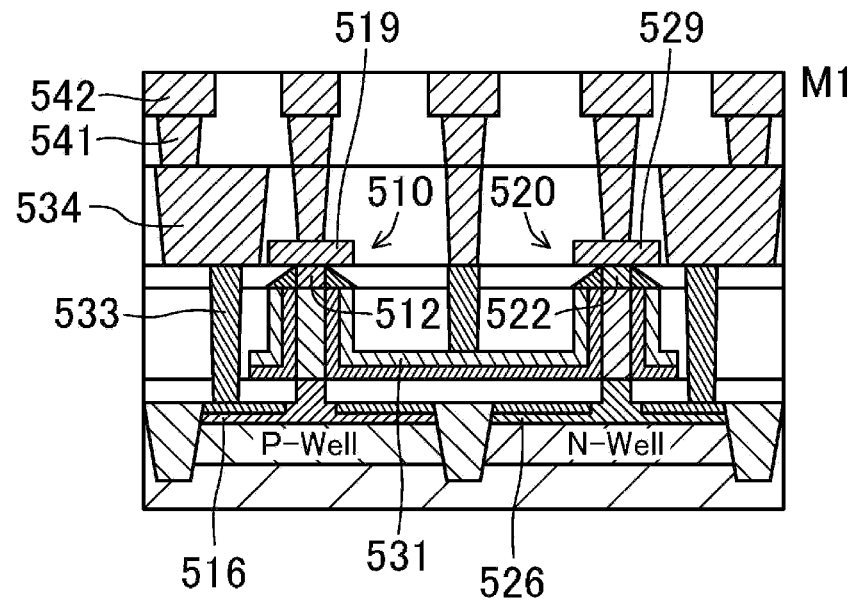
FIGS. 26A and 26B are schematic cross-sectional views showing basic structure examples of vertical nanowire FETs in which local interconnects are used.
Figure 26B:
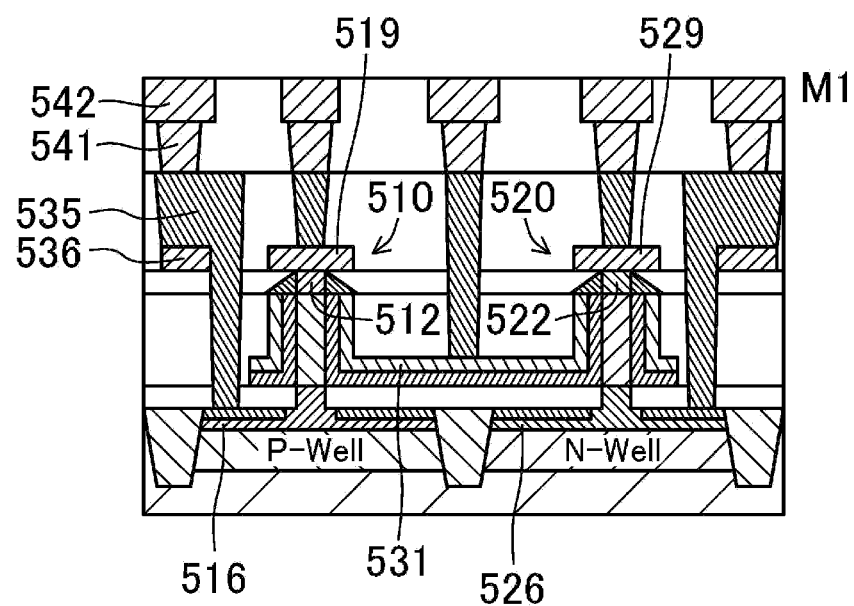

FIGS. 26A and 26B show basic structure examples of VNW FETs in which local interconnects are used. In FIG. 26A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, the local interconnects 534, and the contacts 541. The silicide regions 519 and 529 are individually connected to the interconnects 542 formed in the metal interconnect layer M1 via the local interconnects 534 and the contacts 541.

In FIG. 26B, local interconnects 535 are formed between the metal interconnect layer M1 and the bottom regions 516 and 526. In other words, the local interconnect 535 corresponds to an integrated form of the contact 533 and the local interconnect 534 in FIG. 26A. Silicide regions 536 are used as an etching stopper in the process of forming the local interconnects 535.

In the following description, the bottom electrode, top electrode, and gate electrode of a VNW FET are simply referred to as the bottom, the top, and the gate, respectively, as appropriate. Also, when one or a plurality of configuration units each constituted by a vertical nanowire, a top, a bottom, and a gate constitute one VNW FET, this configuration unit is simply referred to as a "VNW" to distinguish this from the VNW FET. The standard cell is simply referred to as a cell as appropriate. Note that VDD and VSS are used as symbols indicating both the power supply interconnects and the power supply voltages supplied through the power supply interconnects.

As used herein, an expression indicating that widths, etc. are the same, like the "same interconnect width" should be understood as including a range of fabrication variations.

First Embodiment

FIGS. 1, 2A-2B, and 3A-3D are views showing an example of the layout structure of a capacitance cell according to the first embodiment, where FIG. 1 is a plan view, FIGS. 2A and 2B are plan views in different layers, and FIGS. 3A to 3D are cross-sectional views. Specifically, FIG. 2A shows VNW FETs and layers below them, and FIG. 2B shows layers above the VNW FETs. FIGS. 3A and 3B are cross-sectional views in the vertical direction as viewed from top in FIG. 1 and FIGS. 3C and 3D are cross-sectional views in the horizontal direction as viewed from top in FIG. 1, where FIG. 3A shows a cross section taken along line X1-X1', FIG. 3B shows a cross section taken along line X2-X2', FIG. 3C shows a cross section taken along line Y1-Y1', and FIG. 3D shows a cross section taken along line Y2-Y2'.

Figure 4:
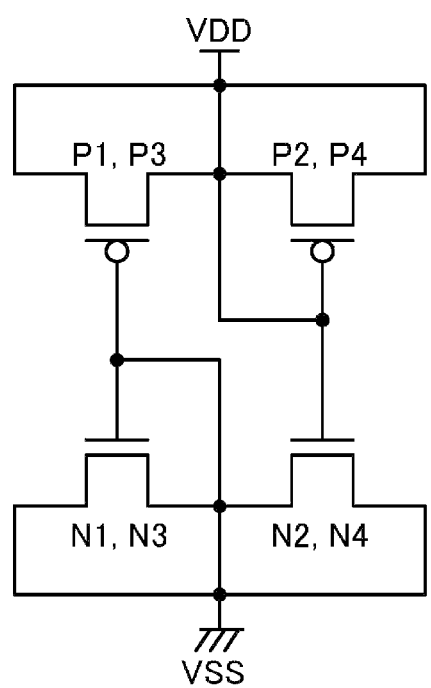
FIG. 4 is a circuit diagram of the capacitance cell according to the first embodiment.

FIG. 4 is a circuit diagram of the capacitance cell shown in FIGS. 1, 2A-2B, and 3A-3D.

Note that, in the following description, in the plan views such as FIG. 1, the horizontal direction as viewed from the figure is referred to as the X direction (corresponding to the first direction) and the vertical direction is referred to as the Y direction (corresponding to the second direction). Also, the dashed lines running vertically and horizontally in the plan views such as FIG. 1 and the dashed lines running vertically in the cross-sectional views such as FIGS. 3A-3D represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs and grid lines for M1 interconnects may be arranged at different spacing from each other. Further, the components may not be necessarily placed on grid lines. It is however preferable to place the components on grid lines from the standpoint of preventing or reducing fabrication variations.

The device structure according to this embodiment is based on the structure of FIG. 26A, although it can be a structure based on the structure of FIG. 25 or FIG. 26B, or based on any other device structure. This also applies to the subsequent embodiments. Also, for easy understanding of the figures, illustration of the wells, the STIs, the insulating films, the silicide layers on the bottoms, the silicide layers on the tops, and the sidewalls of the tops is omitted. This also applies to the subsequent drawings.

As shown in FIGS. 1, 2A-2B, and 3A-3D, power supply interconnects VDD and VSS extending in the X direction are respectively provided on the top and bottom (both ends in the Y direction) of the cell. The power supply interconnects VDD and VSS are formed in the M1 interconnect layer. The power supply interconnects VDD and VSS can be shared by cells upwardly or downwardly adjacent to the interconnects. It is however acceptable to adopt a layout in which the power supply interconnects are not shared by cells upwardly or downwardly adjacent to the interconnects.

A p-type transistor region (shown as Pch, which also applies to the subsequent plan views) and an n-type transistor region (shown as Nch, which also applies to the subsequent plan views) are formed between the power supply interconnects VDD and VSS. The p-type transistor region is provided on the side closer to the power supply interconnect VDD and the n-type transistor region is provided on the side closer to the power supply interconnect VSS. In the p-type transistor region, transistors P1, P2, P3, and P4 are arranged in the X direction. Each of the transistors P1, P2, P3, and P4 has two VNWs lying side by side in the Y direction. In the n-type transistor region, transistors N1, N2, N3, and N4 are arranged in the X direction. Each of the transistors N1, N2, N3, and N4 has two VNWs lying side by side in the Y direction.

The bottoms of the transistors P1, P2, P3, and P4 are connected to a bottom region 11. The bottom region 11 spreads over to a range overlapping the power supply interconnect VDD as viewed from top. The bottom region 11 is connected with the power supply interconnect VDD through local interconnects and vias, to receive the power supply voltage VDD. The tops of the transistors P1, P2, P3, and P4 are respectively connected to local interconnects 31, 33, 35, and 37. The local interconnects 31, 33, 35, and 37 extend in parallel in the Y direction to a region overlapping the power supply interconnect VDD as viewed from top, and are connected with the power supply interconnect VDD through vias.

The bottoms of the transistors N1, N2, N3, and N4 are connected to a bottom region 12. The bottom region 12 spreads over to a range overlapping the power supply interconnect VSS as viewed from top. The bottom region 12 is connected with the power supply interconnect VSS through local interconnects and vias, to receive the power supply voltage VSS. The tops of the transistors N1, N2, N3, and N4 are respectively connected to local interconnects 32, 34, 36, and 38. The local interconnects 32, 34, 36, and 38 extend in parallel in the Y direction to a region overlapping the power supply interconnect VSS as viewed from top, and are connected with the power supply interconnect VSS through vias.

Gate interconnects 21, 22, 23, and 24 extend in parallel in the Y direction across the p-type transistor region and the n-type transistor region. The gates of the transistors P1, P2, P3, and P4 are respectively connected with the gate interconnects 21, 22, 23, and 24, and the gates of the transistors N1, N2, N3, and N4 are respectively connected with the gate interconnects 21, 22, 23, and 24. The gate interconnect 21 is connected with the local interconnect 32 through a via. The gate interconnect 22 is connected with the local interconnect 33 through a via. The gate interconnect 23 is connected with the local interconnect 36 through a via. The gate interconnect 24 is connected with the local interconnect 37 through a via.

With the layout structure as described above, capacitances are formed as follows.

In the transistors P1 and P3, the power supply voltage VDD is supplied to the tops and the bottoms, and the power supply voltage VSS is supplied to the gates. Also, in the transistors N2 and N4, the power supply voltage VSS is supplied to the tops and the bottoms, and the power supply voltage VDD is supplied to the gates. Therefore, the transistors P1, P3, N2, and N4 are ON, forming capacitances between VDD and VSS through the gate oxide film.

Also, in the regions of the transistors P1 and P3, the local interconnects 31 and 35 to which the power supply voltage VDD is supplied, the gate interconnects 21 and 23 to which the power supply voltage VSS is supplied, and the bottom region 11 to which the power supply voltage VDD is supplied overlap one another as viewed from top. Therefore, inter-interconnect capacitances are formed between the local interconnects 31 and 35 and the gate interconnects 21 and 23 and between the gate interconnects 21 and 23 and the bottom region 11. Likewise, in regions of the transistors N2 and N4, the local interconnects 34 and 38 to which the power supply voltage VSS is supplied, the gate interconnects 22 and 24 to which the power supply voltage VDD is supplied, and the bottom region 12 to which the power supply voltage VSS is supplied overlap one another as viewed from top. Therefore, inter-interconnect capacitances are formed between the local interconnects 34 and 38 and the gate interconnects 22 and 24 and between the gate interconnects 22 and 24 and the bottom region 12.

Also, the gate interconnects 21 and 23 to which the power supply voltage VSS is supplied and the gate interconnects 22 and 24 to which the power supply voltage VDD is supplied are alternately placed in the X direction. Therefore, inter-interconnect capacitances are formed between the gate interconnects 21 and 22, between the gate interconnects 22 and 23, and between the gate interconnects 23 and 24 in the X direction.

Moreover, in the center portion of the capacitance cell in the Y direction, inter-interconnect capacitances are formed between the local interconnects 32 and 33, between the local interconnects 33 and 36, and between the local interconnects 36 and 37 in the X direction. Also, inter-interconnect capacitances are formed between the local interconnects 31 and 32, between the local interconnects 33 and 34, between the local interconnects 35 and 36, and between the local interconnects 37 and 38 in the Y direction.

Thus, in this embodiment, a capacitance cell capable of sufficiently securing a capacitance value can be implemented using VNW FETs.

The transistors P1 to P4 and N1 to N4 constituting the capacitance cell according to this embodiment are so-called dummy VNW FETs that do not contribute to the logical function of the circuit. By placing such dummy VNW FETs, in the resultant semiconductor integrated circuit device, the distribution of VNW FETs is made uniform, increasing the fabrication precision and also preventing or reducing variations in transistor characteristics. Also, by placing the gate interconnects 21 to 24, variations in gate pattern are prevented or reduced, increasing the fabrication precision and also preventing or reducing variations in transistor characteristics.

The gate interconnects 21, 22, 23, and 24 all extend in the Y direction and have the same interconnect width. This makes fabrication easy and increases the fabrication precision. The local interconnects 31, 32, 33, 34, 35, 36, 37, and 38 all extend in the Y direction and have the same interconnect width. This makes fabrication easy and increases the fabrication precision.

In the layout structure described above, the bottom region 11 is formed integrally over the entire region of the transistors P1 to P4, and the bottom region 12 is formed integrally over the entire region of the transistors N1 to N4. Alternatively, the bottom regions 11 and 12 may be formed in separate forms. For example, the bottom region 11 may be divided for the transistors P1 to P4 to form individual regions long in the Y direction.

In the layout structure described above, the transistors P2, P4, N1, and N3 may be omitted.

(Alteration of First Embodiment)

FIG. 5 is a plan view showing an example of the layout structure of a capacitance cell according to an alteration. In this alteration, M1 interconnects 41, 42, 43, and 44 extending in parallel in the X direction are added to the layout structure of FIG. 1. The M1 interconnect 41 is connected with the local interconnects 31, 33, 35, and 37 to which the power supply voltage VDD is supplied through vias. The M1 interconnect 42 is connected with the local interconnects 32 and 36 to which the power supply voltage VSS is supplied through vias. The M1 interconnect 43 is connected with the local interconnects 33 and 37 to which the power supply voltage VDD is supplied through vias. The M1 interconnect 44 is connected with the local interconnects 32, 34, 36, and 38 to which the power supply voltage VSS is supplied through vias.

With the above configuration, inter-interconnect capacitances are formed between the M1 interconnects 41 and 42, between the M1 interconnects 42 and 43, and between the M1 interconnects 43 and 44 in the Y direction. This further increases the capacitance value of the capacitance cell. Also, the M1 interconnects 41, 42, 43, and 44 all extend in the X direction and have the same interconnect width. This makes the fabrication easy and increases the fabrication precision.

Second Embodiment

FIGS. 6, 7A-7B, and 8A-8D are views showing an example of the layout structure of a capacitance cell according to the second embodiment, where FIG. 6 is a plan view, FIGS. 7A and 7B are plan views in different layers, and FIGS. 8A to 8D are cross-sectional views. Specifically, FIG. 7A shows VNW FETs and layers below them, and FIG. 7B shows layers above the VNW FETs. FIGS. 8A and 8B are cross-sectional views in the vertical direction as viewed from top in FIG. 6 and FIGS. 8C and 8D are cross-sectional views in the horizontal direction as viewed from top in FIG. 6, where FIG. 8A shows a cross section taken along line X1-X1', FIG. 8B shows a cross section taken along line X2-X2', FIG. 8C shows a cross section taken along line Y1-Y1', and FIG. 8D shows a cross section taken along line Y2-Y2'.

Figure 9:
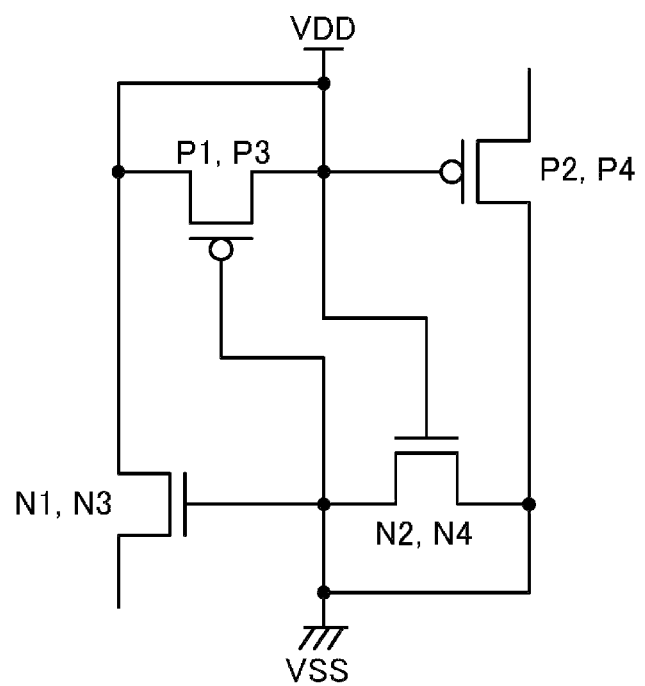
FIG. 9 is a circuit diagram of the capacitance cell according to the second embodiment.

FIG. 9 is a circuit diagram of the capacitance cell shown in FIGS. 6, 7A-7B, and 8A-8D.

The capacitance cell according to this embodiment is different from the capacitance cell according to the first embodiment in that the transistors P2, P4, N1, and N3 are each constituted by one VNW and that a bottom region is separately formed for each transistor. Note that, in the following description, description may be omitted for a configuration in common with the first embodiment.

In the p-type transistor region, bottom regions 111, 112, 113, and 114 are formed to extend in parallel in the Y direction. The bottom regions 111 and 113 extend to a region overlapping the power supply interconnect VDD as viewed from top, and are connected with the power supply interconnect VDD via local interconnects and vias, to receive the power supply voltage VDD. The bottom regions 112 and 114 do not overlap the power supply interconnect VDD as viewed from top. The bottoms of the transistors P1, P2, P3, and P4 are respectively connected with the bottom regions 111, 112, 113, and 114.

In the n-type transistor region, bottom regions 115, 116, 117, and 118 are formed to extend in parallel in the Y direction. The bottom regions 116 and 118 extend to a region overlapping the power supply interconnect VSS as viewed from top, and are connected with the power supply interconnect VSS via local interconnects and vias, to receive the power supply voltage VSS. The bottom regions 115 and 117 do not overlap the power supply interconnect VSS as viewed from top. The bottoms of the transistors N1, N2, N3, and N4 are respectively connected with the bottom regions 115, 116, 117, and 118.

The tops of the transistors P1 and N1 are connected with a local interconnect 131. The tops of the transistors P2 and N2 are connected with a local interconnect 134. The tops of the transistors P3 and N3 are connected with a local interconnect 135. The tops of the transistors P4 and N4 are connected with a local interconnect 138. The local interconnects 131, 134, 135, and 138 extend in parallel in the Y direction. The local interconnects 131 and 135 extend to a region overlapping the power supply interconnect VDD as viewed from top, and are connected with the power supply interconnect VDD through vias, to receive the power supply voltage VDD. The local interconnects 134 and 138 extend to a region overlapping the power supply interconnect VSS as viewed from top, and are connected with the power supply interconnect VSS through vias, to receive the power supply voltage VSS.

Local interconnects 132, 133, 136, and 137 are placed to face the local interconnects 131, 134, 135, and 138, respectively, in the Y direction. The local interconnects 132 and 136 extend to a region overlapping the power supply interconnect VSS as viewed from top, and are connected with the power supply interconnect VSS through vias, to receive the power supply voltage VSS. The local interconnects 133 and 137 extend to a region overlapping the power supply interconnect VDD as viewed from top, and are connected with the power supply interconnect VDD through vias, to receive the power supply voltage VDD.

Gate interconnects 121, 122, 123, and 124 extend in parallel in the Y direction across the p-type transistor region and the n-type transistor region. The gates of the transistors P1, P2, P3, and P4 are respectively connected with the gate interconnects, 121, 122, 123, and 124. The gates of the transistors N1, N2, N3, and N4 are respectively connected with the gate interconnects, 121, 122, 123, and 124. The gate interconnect 121 is connected with the local interconnect 132 through a via. The gate interconnect 122 is connected with the local interconnect 133 through a via. The gate interconnect 123 is connected with the local interconnect 136 through a via. The gate interconnect 124 is connected with the local interconnect 137 through a via. That is, the power supply voltage VSS is supplied to the gate interconnects 121 and 123, and the power supply voltage VDD is supplied to the gate interconnects 122 and 124.

With the layout structure as described above, capacitances are formed as follows.

In the transistors P1 and P3, the power supply voltage VDD is supplied to the tops and the bottoms, and the power supply voltage VSS is supplied to the gates. Also, in the transistors N2 and N4, the power supply voltage VSS is supplied to the tops and the bottoms, and the power supply voltage VDD is supplied to the gates. Therefore, the transistors P1, P3, N2, and N4 are ON, forming capacitances between VDD and VSS through the gate oxide film.

Also, in the regions of the transistors P1 and P3, the local interconnects 131 and 135 to which the power supply voltage VDD is supplied, the gate interconnects 121 and 123 to which the power supply voltage VSS is supplied, and the bottom regions 111 and 113 to which the power supply voltage VDD is supplied overlap one another as viewed from top. Therefore, inter-interconnect capacitances are formed between the local interconnects 131 and 135 and the gate interconnects 121 and 123 and between the gate interconnects 121 and 123 and the bottom regions 111 and 113. Likewise, in the regions of the transistors N2 and N4, the local interconnects 134 and 138 to which the power supply voltage VSS is supplied, the gate interconnects 122 and 124 to which the power supply voltage VDD is supplied, and the bottom regions 116 and 118 to which the power supply voltage VSS is supplied overlap one another as viewed from top. Therefore, inter-interconnect capacitances are formed between the local interconnects 134 and 138 and the gate interconnects 122 and 124 and between the gate interconnects 122 and 124 and the bottom regions 116 and 118.

Also, the gate interconnects 121 and 123 to which the power supply voltage VSS is supplied and the gate interconnects 122 and 124 to which the power supply voltage VDD is supplied are alternately placed in the X direction. Therefore, inter-interconnect capacitances are formed between the gate interconnects 121 and 122, between the gate interconnects 122 and 123, and between the gate interconnects 123 and 124 in the X direction.

Moreover, in the center portion of the capacitance cell in the Y direction, inter-interconnect capacitances are formed between the local interconnects 131 and 134, between the local interconnects 134 and 135, and between the local interconnects 135 and 138 in the X direction. Also, inter-interconnect capacitances are formed between the local interconnects 131 and 132, between the local interconnects 133 and 134, between the local interconnects 135 and 136, and between the local interconnects 137 and 138 in the Y direction.

Thus, in this embodiment, a capacitance cell capable of sufficiently securing a capacitance value can be implemented using VNW FETs.

The transistors P1 to P4 and N1 to N4 constituting the capacitance cell according to this embodiment are so-called dummy VNW FETs that do not contribute to the logical function of the circuit. By placing such dummy VNW FETs, in the resultant semiconductor integrated circuit device, the distribution of VNW FETs is made uniform, increasing the fabrication precision and also preventing or reducing variations in transistor characteristics. Also, by placing the gate interconnects 121 to 124, variations in gate pattern are prevented or reduced, increasing the fabrication precision and also preventing or reducing variations in transistor characteristics.

The gate interconnects 121, 122, 123, and 124 all extend in the Y direction and have the same interconnect width. This makes fabrication easy and increases the fabrication precision. The local interconnects 131, 132, 133, 134, 135, 136, 137, and 138 all extend in the Y direction and have the same interconnect width. This makes fabrication easy and increases the fabrication precision.

In the layout structure described above, no power supply voltage is supplied to any of the bottom regions 112, 114, 115, and 117, making the bottoms of the transistors P2, P4, N1, and N3 floating. Alternatively, the power supply voltage VDD may be supplied to the bottom regions 112 and 114, and the power supply voltage VSS may be supplied to the bottom regions 115 and 117. Otherwise, the bottom regions 112, 114, 115, and 117 may be omitted, or the transistors P2, P4, N1, and N3 may be omitted.

In the layout structure described above, the bottom regions 111, 112, 113, and 114 may be formed integrally, and the bottom regions 115, 116, 117, and 118 may be formed integrally, as in the first embodiment.

Also, as in the alteration of the first embodiment, a plurality of M1 interconnects extending in the X direction may be placed. This will form inter-interconnect capacitances between the M1 interconnects.

(Alteration 1 of Second Embodiment)

FIGS. 10 and 11A-11B are views showing an example of the layout structure of a capacitance cell according to this alteration, where FIG. 10 is a plan view and FIGS. 11A and 11B are plan views in different layers. Specifically, FIG. 11A shows VNW FETs and layers below them, and FIG. 11B shows layers above the VNW FETs.

In this alteration, the transistors P2, P4, N1, and N3 are each constituted by two VNWs as in the first embodiment. A gate interconnect 121A connected with the gates of the transistors P1 and N1 and a gate interconnect 123A connected with the gates of the transistors P3 and N3 extend to a region overlapping the power supply interconnect VSS. The gate interconnects 121A and 123A are connected with the power supply interconnect VSS through vias at positions overlapping the power supply interconnect VSS. Also, a gate interconnect 122A connected with the gates of the transistors P2 and N2 and a gate interconnect 124A connected with the gates of the transistors P4 and N4 extend to a region overlapping the power supply interconnect VDD. The gate interconnects 122A and 124A are connected with the power supply interconnect VDD through vias at positions overlapping the power supply interconnect VDD.

A local interconnect 131A connected with the tops of the transistors P1 and N1 is formed longer than the local interconnect 131 in the second embodiment. Likewise, a local interconnect 134A connected with the tops of the transistors P2 and N2, a local interconnect 135A connected with the tops of the transistors P3 and N3, and a local interconnect 138A connected with the tops of the transistors P4 and N4 are respectively formed longer than the local interconnects 134, 135, and 138 in the second embodiment.

Figures 12A, 12B:
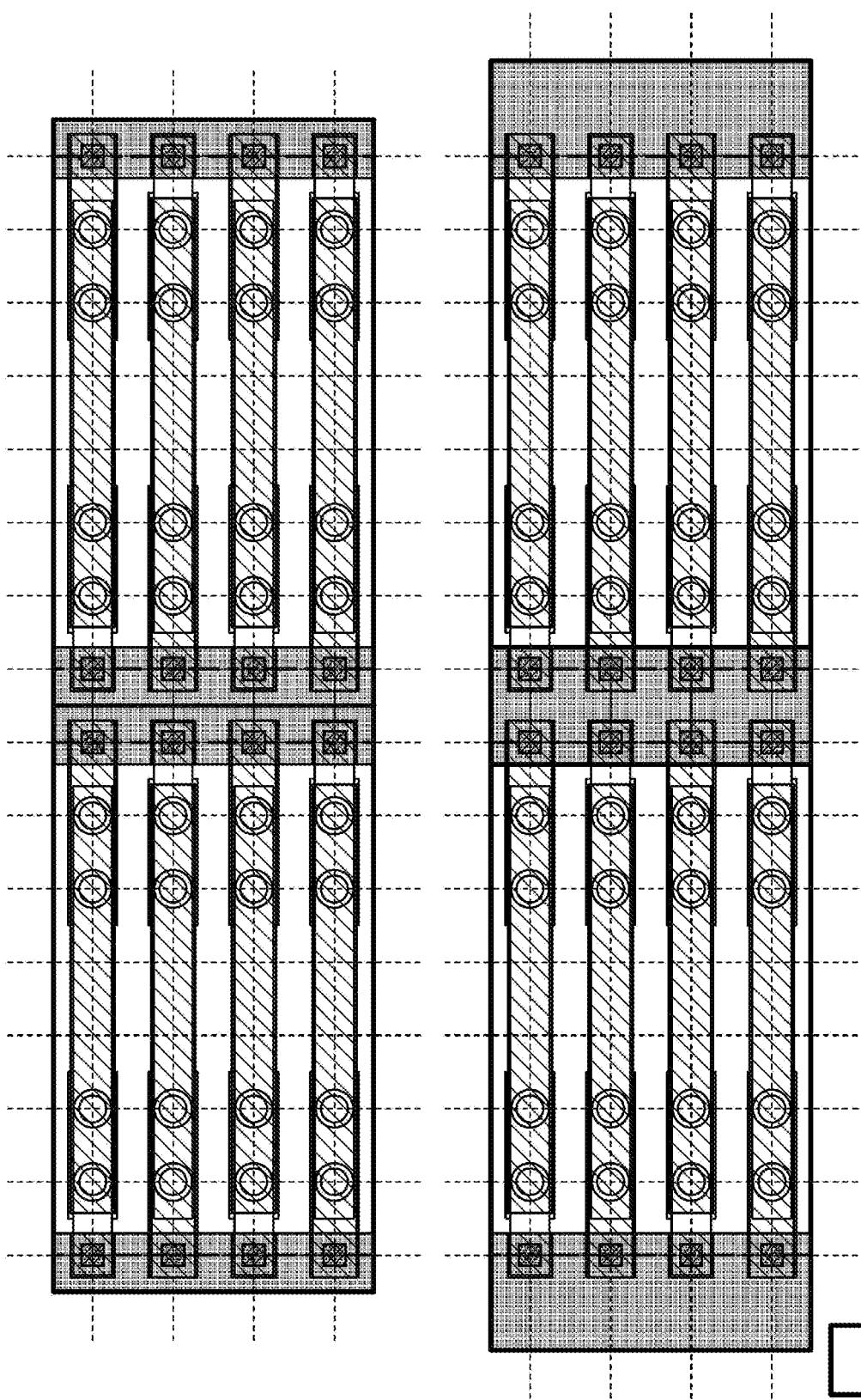
FIGS. 12A and 12B show examples in which the capacitance cells according to Alteration 1 of the second embodiment are placed vertically adjacent to each other.

In this alteration, the uniformity of the distribution of VNW FETs improves more than in the second embodiment. However, since the power supply to the gate interconnects 121A, 122A, 123A, and 124A is performed below the power supply interconnects VDD and VSS, the power supply interconnects cannot be shared between vertically adjacent cells in this layout as it is, as shown in FIG. 12A. Sharing of the power supply interconnects will be possible by increasing the width of the power supply interconnects as shown in FIG. 12B.

(Alteration 2 of Second Embodiment)

FIG. 13 is a plan view showing an example of the layout structure of a capacitance cell according to this alteration. In FIG. 13, the bottom region 11 is formed integrally over the p-type transistor region, and the bottom region 12 is formed integrally over the n-type transistor region. The other configuration is similar to that in FIG. 6.

Third Embodiment

FIGS. 14, 15A-15C, and 16A-16D are views showing an example of the layout structure of a capacitance cell according to the third embodiment, where FIG. 14 is a plan view, FIGS. 15A to 15C are plan views in different layers, and FIGS. 16A to 16D are cross-sectional views. Specifically, FIG. 15A shows VNW FETs and layers below them, FIG. 15B shows local interconnects and M1 interconnects, and FIG. 15C shows the M1 interconnects and M2 interconnects. FIGS. 16A and 16B are cross-sectional views in the vertical direction as viewed from top in FIG. 14 and FIGS. 16C and 16D are cross-sectional views in the horizontal direction as viewed from top in FIG. 14, where FIG. 16A shows a cross section taken along line X1-X1', FIG. 16B shows a cross section taken along line X2-X2', FIG. 16C shows a cross section taken along line Y1-Y1', and FIG. 16D shows a cross section taken along line Y2-Y2'.

Figure 17:
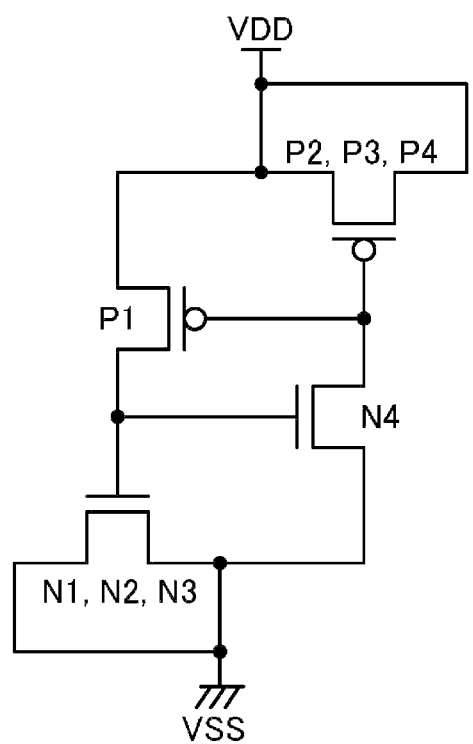
FIG. 17 is a circuit diagram of the capacitance cell according to the third embodiment.

FIG. 17 is a circuit diagram of the capacitance cell shown in FIGS. 14, 15A-15C, and 16A-16D. As shown in FIG. 17, this capacitance cell has transistors P2, P3, P4, N1, N2, and N3 as transistors constituting a capacitance part. Also, transistors P1 and N4 constitute a fixed value output part that outputs fixed values (VDD and VSS) to the gates of the transistors constituting the capacitance part. VDD (i.e., a high fixed value) is supplied from the drain of the transistor P1 to the gates of the transistors N1, N2, N3, and N4. VSS (i.e., a low fixed value) is supplied from the drain of the transistor N4 to the gates of the transistors P1, P2, P3, and P4.

As shown in FIGS. 14, 15A-15C, and 16A-16D, in the p-type transistor region, the transistors P1, P2, P3, and P4 are arranged in the X direction. Each of the transistors P1, P2, P3, and P4 has two VNWs lying side by side in the Y direction. In the n-type transistor region, the transistors N1, N2, N3, and N4 are arranged in the X direction. Each of the transistors N1, N2, N3, and N4 has two VNWs lying side by side in the Y direction.

The bottoms of the transistors P1, P2, P3, and P4 are connected to a bottom region 211. The bottom region 211 spreads over to a range overlapping the power supply interconnect VDD as viewed from top. The bottom region 211 is connected with the power supply interconnect VDD through local interconnects and vias, to receive the power supply voltage VDD. The tops of the transistors P1, P2, P3, and P4 are respectively connected to local interconnects 231a, 232a, 233a, and 234a. The local interconnects 231a, 232a, 233a, and 234a extend in parallel in the Y direction. The local interconnects 232a, 233a, and 234a extend to a region overlapping the power supply interconnect VDD as viewed from top, and are connected with the power supply interconnect VDD through vias.

The bottoms of the transistors N1, N2, N3, and N4 are connected to a bottom region 212. The bottom region 212 spreads over to a range overlapping the power supply interconnect VSS as viewed from top. The bottom region 212 is connected with the power supply interconnect VSS through local interconnects and vias, to receive the power supply voltage VSS. The tops of the transistors N1, N2, N3, and N4 are respectively connected to local interconnects 231b, 232b, 233b, and 234b. The local interconnects 231b, 232b, 233b, and 234b extend in parallel in the Y direction. The local interconnects 231b, 232b, and 233b extend to a region overlapping the power supply interconnect VSS as viewed from top, and are connected with the power supply interconnect VSS through vias.

Gate interconnects 221, 222, 223, and 224 extend in parallel in the Y direction in the p-type transistor region. The gates of the transistors P1, P2, P3, and P4 are respectively connected with the gate interconnects 221, 222, 223, and 224. Gate interconnects 225, 226, 227, and 228 extend in parallel in the Y direction in the n-type transistor region. The gates of the transistors N1, N2, N3, and N4 are respectively connected with the gate interconnects 225, 226, 227, and 228.

M1 interconnects 241, 242, 243, and 244 extend in parallel in the X direction. The M1 interconnect 241 is connected with the local interconnect 231a through a via. The M1 interconnect 242 is connected with the gate interconnects 221, 222, 223, and 224 through vias. The M1 interconnect 243 is connected with the gate interconnects 225, 226, 227, and 228 through vias. The M1 interconnect 244 is connected with the local interconnect 234b through a via.

M2 interconnects 251 and 252 extend in the Y direction. The M2 interconnect 251 is connected with the M1 interconnects 241 and 243 through vias. The M2 interconnect 252 is connected with the M1 interconnects 242 and 244 through vias.

With the layout structure as described above, capacitances are formed as follows.

In the transistor P1, the power supply voltage VDD is supplied to the bottom, and the top is connected with the gates of the transistors N1, N2, N3, and N4 through the local interconnect 231a, the M1 interconnect 241, the M2 interconnect 251, the M1 interconnect 243, and the gate interconnects 225, 226, 227, and 228. In the transistor N4, the power supply voltage VSS is supplied to the bottom, and the top is connected with the gates of the transistors P1, P2, P3, and P4 through the local interconnect 234b, the M1 interconnect 244, the M2 interconnect 252, the M1 interconnect 242, and the gate interconnects 221, 222, 223, and 224.

In the transistors P2, P3, and P4, the power supply voltage VDD is supplied to the tops and the bottoms, and the power supply voltage VSS is supplied to the gates from the power supply interconnect VSS through the transistor N4 and the top of the transistor N4. In the transistors N1, N2, and N3, the power supply voltage VSS is supplied to the tops and the bottoms, and the power supply voltage VDD is supplied to the gates from the power supply interconnect VDD through the transistor P1 and the top of the transistor P1. Therefore, the transistors P2, P3, P4, N1, N2, and N3 are ON, forming capacitances between VDD and VSS through the gate oxide film.

Also, in the regions of the transistors P2, P3, and P4, the local interconnects 232a, 233a, and 234a to which the power supply voltage VDD is supplied, the gate interconnects 222, 223, and 224 to which the power supply voltage VSS is supplied, and the bottom region 211 to which the power supply voltage VDD is supplied overlap one another as viewed from top. Therefore, inter-interconnect capacitances are formed between the local interconnects 232a, 233a, and 234a and the gate interconnects 222, 223, and 224 and between the gate interconnects 222, 223, and 224 and the bottom region 211. In the region of the transistor P1, also, the local interconnect 231a to which the power supply voltage VDD is supplied, the gate interconnect 221 to which the power supply voltage VSS is supplied, and the bottom region 211 to which the power supply voltage VDD is supplied overlap as viewed from top. Therefore, inter-interconnect capacitances are formed between the local interconnect 231a and the gate interconnect 221 and between the gate interconnect 221 and the bottom region 211.

Likewise, in the regions of the transistors N1, N2, and N3, the local interconnects 231b, 232b, and 233b to which the power supply voltage VSS is supplied, the gate interconnects 225, 226, and 227 to which the power supply voltage VDD is supplied, and the bottom region 212 to which the power supply voltage VSS is supplied overlap one another as viewed from top. Therefore, inter-interconnect capacitances are formed between the local interconnects 231b, 232b, and 233b and the gate interconnects 225, 226, and 227 and between the gate interconnects 225, 226, and 227 and the bottom region 212. In the region of the transistor N4, also, the local interconnect 234b to which the power supply voltage VSS is supplied, the gate interconnect 228 to which the power supply voltage VDD is supplied, and the bottom region 212 to which the power supply voltage VSS is supplied overlap one another as viewed from top. Therefore, inter-interconnect capacitances are formed between the local interconnect 234b and the gate interconnect 228 and between the gate interconnect 228 and the bottom region 212.

Thus, in this embodiment, a capacitance cell capable of sufficiently securing a capacitance value can be implemented using VNW FETs.

The transistors P1 to P4 and N1 to N4 constituting the capacitance cell of this embodiment are so-called dummy VNW FETs that do not contribute to the logical function of the circuit. By placing such dummy VNW FETs, in the resultant semiconductor integrated circuit device, the distribution of VNW FETs is made uniform, increasing the fabrication precision and also preventing or reducing variations in transistor characteristics. Also, by placing the gate interconnects 221 to 228, variations in gate pattern are prevented or reduced, increasing the fabrication precision and also preventing or reducing variations in transistor characteristics.

The gate interconnects 221, 222, 223, 224, 225, 226, 227, and 228 all extend in the Y direction and have the same interconnect width. This makes fabrication easy and increases the fabrication precision. The local interconnects 231a, 231b, 232a, 232b, 233a, 233b, 234a, and 234b all extend in the Y direction and have the same interconnect width. This makes fabrication easy and increases the fabrication precision. The M1 interconnects 241, 242, 243, and 244 all extend in the X direction and have the same interconnect width. This makes fabrication easy and increases the fabrication precision. The M2 interconnects 251 and 252 extend in the Y direction and have the same interconnect width. This makes fabrication easy and increases the fabrication precision.

In the layout structure described above, the bottom region 211 is formed integrally over the entire region of the transistors P1 to P4, and the bottom region 212 is formed integrally over the entire region of the transistors N1 to N4. Alternatively, the bottom regions 211 and 212 may be formed in separate forms. For example, the bottom region 211 may be divided for the transistors P1 to P4 to form individual regions long in the Y direction.

(Alteration of Third Embodiment)

FIG. 18 is a plan view showing an example of the layout structure of a capacitance cell according to this alteration. In this alteration, the transistors P1, P2, P3, and P4 and the transistors N1, N2, N3, and N4 each have one VNW. Local interconnects 235a, 236a, 237a, and 238a for connecting the gate interconnects 221, 222, 223, and 224 with the M1 interconnect 242 are formed to extend in the Y direction. Also, local interconnects 235b, 236b, 237b, and 238b for connecting the gate interconnects 225, 226, 227, and 228 with the M1 interconnect 243 are formed to extend in the Y direction.

In this layout structure, compared with the layout structure of the third embodiment described above, the size of the local interconnects connected with the M1 interconnects 242 and 243 is large, whereby formation of the local interconnects becomes easy. Also, the distance between the gate interconnects 221, 222, 223, and 224 in the p-type transistor region and the gate interconnects 225, 226, 227, and 228 in the n-type transistor region can be made large, whereby formation of the gate interconnects becomes easy.

Fourth Embodiment

Figure 19:
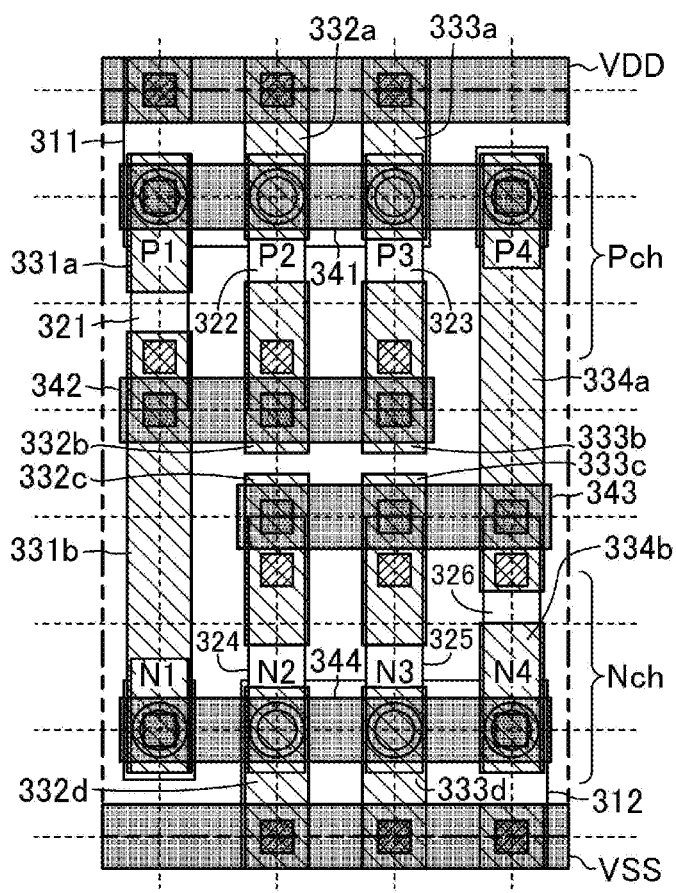
FIG. 19 is a plan view showing an example of the layout structure of a capacitance cell according to the fourth embodiment.
Figure 20:
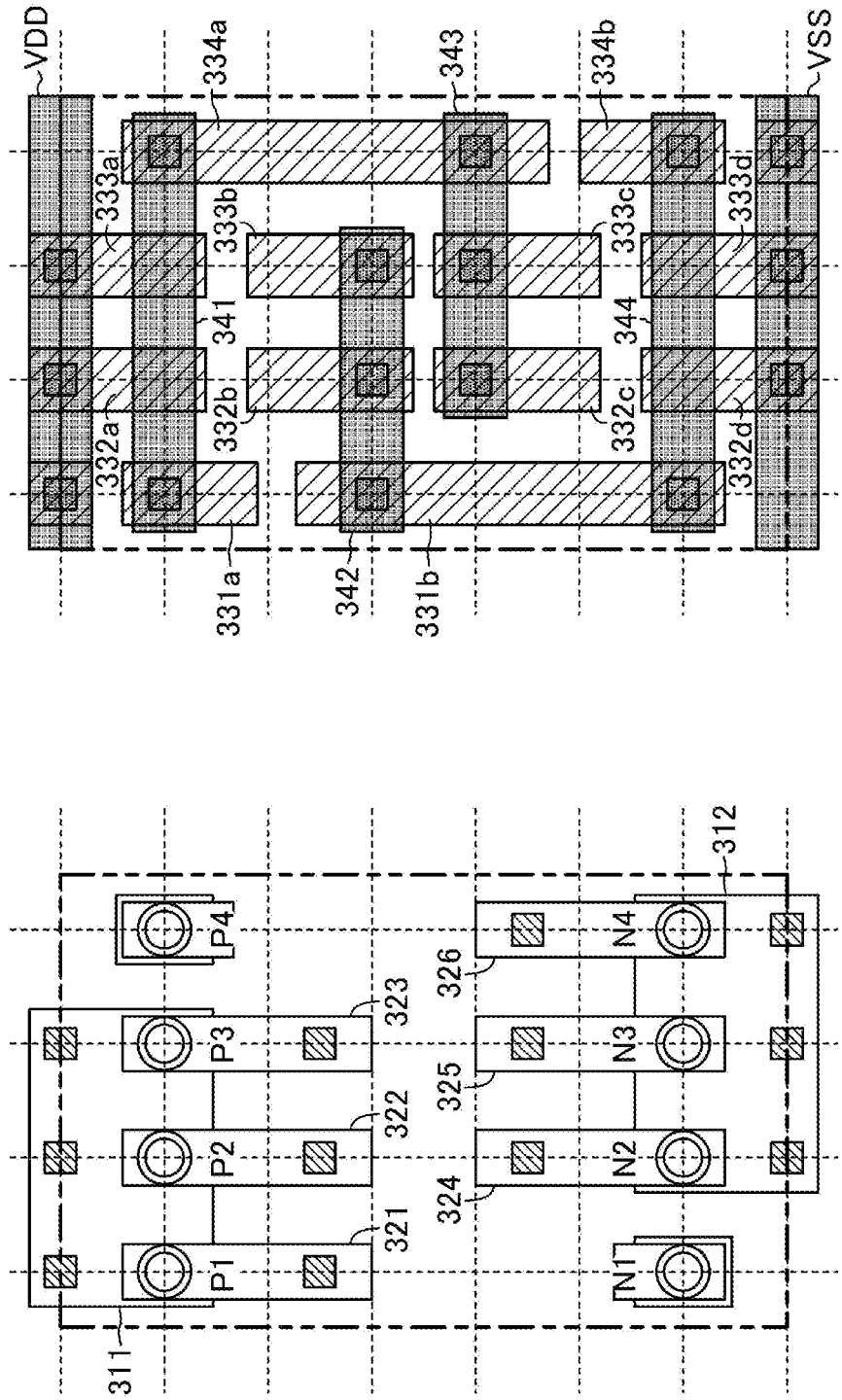
FIGS. 20A and 20B are plan views in different layers showing the layout structure of the capacitance cell according to the fourth embodiment.

FIGS. 19 and 20A-20B are views showing an example of the layout structure of a capacitance cell according to the fourth embodiment, where FIG. 19 is a plan view and FIG. 20A and FIG. 20B are plan views in different layers. Specifically, FIG. 20A shows VNW FETs and layers below them, and FIG. 20B shows layers above VNW FETs.

Figure 21:
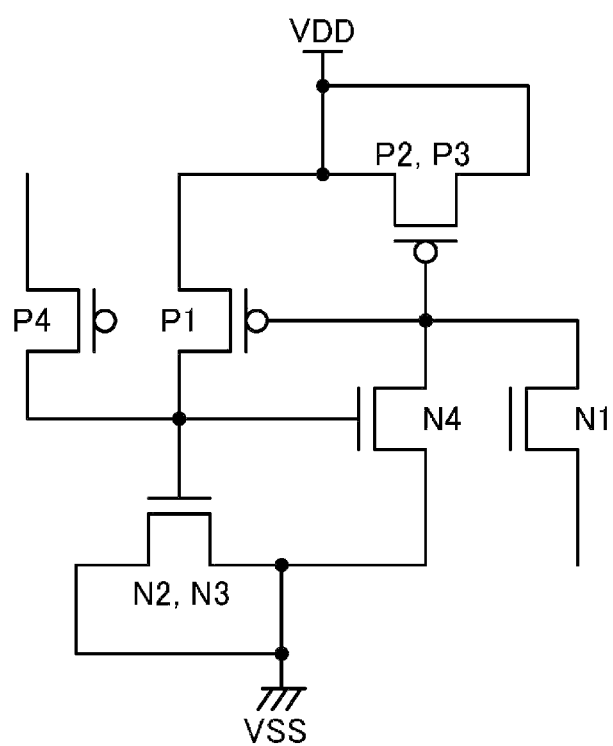
FIG. 21 is a circuit diagram of the capacitance cell according to the fourth embodiment.

FIG. 21 is a circuit diagram of the capacitance cell shown in FIGS. 19 and 20A-20B. As shown in FIG. 21, this capacitance cell has transistors P2, P3, N2, and N3 as transistors constituting a capacitance part. Also, transistors P1 and N4 constitute a fixed value output part that outputs fixed values (VDD and VSS) to the gates of the transistors constituting the capacitance part. VDD (i.e., a high fixed value) is supplied from the drain of the transistor P1 to the gates of the transistors N2, N3, and N4. VSS (i.e., a low fixed value) is supplied from the drain of the transistor N4 to the gates of the transistors P1, P2, and P3. The transistors P4 and N1 are floating at their gates and sources.

In this embodiment, unlike the third embodiment, no M2 interconnects are used. Also, the transistors P1, P2, P3, and P4 and the transistors N1, N2, N3, and N4 each have one VNW.

The bottoms of the transistors P1, P2, and P3 are connected to a bottom region 311. The bottom region 311 spreads over to a range overlapping the power supply interconnect VDD as viewed from top. The bottom region 311 is connected with the power supply interconnect VDD through local interconnects and vias, to receive the power supply voltage VDD. The tops of the transistors P1, P2, P3, and P4 are respectively connected to local interconnects 331a, 332a, 333a, and 334a. The local interconnects 331a, 332a, 333a, and 334a extend in parallel in the Y direction. The local interconnects 332a and 333a extend to a region overlapping the power supply interconnect VDD as viewed from top, and are connected with the power supply interconnect VDD through vias.

The bottoms of the transistors N2, N3, and N4 are connected to a bottom region 312. The bottom region 312 spreads over to a range overlapping the power supply interconnect VSS as viewed from top. The bottom region 312 is connected with the power supply interconnect VSS through local interconnects and vias, to receive the power supply voltage VSS. The tops of the transistors N1, N2, N3, and N4 are respectively connected to local interconnects 331b, 332d, 333d, and 334b. The local interconnects 331b, 332d, 333d, and 334b extend in parallel in the Y direction. The local interconnects 332d and 333d extend to a region overlapping the power supply interconnect VSS as viewed from top, and are connected with the power supply interconnect VSS through vias.

Gate interconnects 321, 322, and 323 extend in parallel in the Y direction in the p-type transistor region. The gates of the transistors P1, P2, and P3 are respectively connected with the gate interconnects 321, 322, and 223. Gate interconnects 324, 325, and 326 extend in parallel in the Y direction in the n-type transistor region. The gates of the transistors N2, N3, and N4 are respectively connected with the gate interconnects 324, 325, and 326.

Local interconnects 332b, 333b, 332c, and 333c are placed to extend in the Y direction. The local interconnects 332b, 333b, 332c, and 333c are respectively connected with the gate interconnects 322, 323, 324, and 325 through vias. The gate interconnect 321 is connected with the local interconnect 331b, and the gate interconnect 326 is connected with the local interconnect 334a.

M1 interconnects 341, 342, 343, and 344 extend in parallel in the X direction. The M1 interconnect 341 is connected with the local interconnects 331a and 334a through vias. The M1 interconnect 342 is connected with the local interconnects 331b, 332b, and 333b through vias. The M1 interconnect 343 is connected with the local interconnects 332c, 333c, and 334a through vias. The M1 interconnect 344 is connected with the local interconnects 331b and 334b through vias.

With the layout structure as described above, capacitances are formed as follows.

In the transistor P1, the power supply voltage VDD is supplied to the bottom, and the top is connected with the gates of the transistors N2, N3, and N4 through the local interconnect 331a, the M1 interconnect 341, the local interconnect 334a, the M1 interconnect 343, the local interconnects 332c and 333c, and the gate interconnects 324, 325, and 326. In the transistor N4, the power supply voltage VSS is supplied to the bottom, and the top is connected with the gates of the transistors P1, P2, and P3 through the local interconnect 334b, the M1 interconnect 344, the local interconnect 331b, the M1 interconnect 342, the local interconnects 332b and 333b, and the gate interconnects 321, 322, and 323.

In the transistors P2 and P3, the power supply voltage VDD is supplied to the tops and the bottoms, and the power supply voltage VSS is supplied to the gates from the power supply interconnect VSS through the transistor N4 and the top of the transistor N4. In the transistors N2 and N3, the power supply voltage VSS is supplied to the tops and the bottoms, and the power supply voltage VDD is supplied to the gates from the power supply interconnect VDD through the transistor P1 and the top of the transistor P1. Therefore, the transistors P2, P3, N2, and N3 are ON, forming capacitances between VDD and VSS through the gate oxide film.

In the transistor P4, the top is connected with the top of the transistor P1 through the M1 interconnect 341 and the local interconnects 331a and 334a. The bottom and gate thereof are floating. In the transistor N1, the top is connected with the top of the transistor N4 through the M1 interconnect 344 and the local interconnects 331b and 334b. The bottom and gate thereof are floating.

In the regions of the transistors P2 and P3, the local interconnects 332a and 333a to which the power supply voltage VDD is supplied, the gate interconnects 322 and 323 to which the power supply voltage VSS is supplied, and the bottom region 311 to which the power supply voltage VDD is supplied overlap one another as viewed from top. Therefore, inter-interconnect capacitances are formed between the local interconnects 332a and 333a and the gate interconnects 322 and 323 and between the gate interconnects 322 and 323 and the bottom region 311. In the region of the transistor P1, also, the local interconnect 331a to which the power supply voltage VDD is supplied, the gate interconnect 321 to which the power supply voltage VSS is supplied, and the bottom region 311 to which the power supply voltage VDD is supplied overlap one another as viewed from top. Therefore, inter-interconnect capacitances are formed between the local interconnect 331a and the gate interconnect 321 and between the gate interconnect 321 and the bottom region 311.

Likewise, in the regions of the transistors N2 and N3, the local interconnects 332d and 333d to which the power supply voltage VSS is supplied, the gate interconnects 324 and 325 to which the power supply voltage VDD is supplied, and the bottom region 312 to which the power supply voltage VSS is supplied overlap one another as viewed from top. Therefore, inter-interconnect capacitances are formed between the local interconnects 332d and 333d and the gate interconnects 324 and 325 and between the gate interconnects 324 and 325 and the bottom region 312. In the region of the transistor N4, also, the local interconnect 334b to which the power supply voltage VSS is supplied, the gate interconnect 326 to which the power supply voltage VDD is supplied, and the bottom region 312 to which the power supply voltage VSS is supplied overlap one another as viewed from top. Therefore, inter-interconnect capacitances are formed between the local interconnect 334b and the gate interconnect 326 and between the gate interconnect 326 and the bottom region 312.

As for the local interconnects, inter-interconnect capacitances are formed between the local interconnects 331a, 332a, 332c, 333a, 333c, and 334a to which the power supply voltage VDD is supplied and the local interconnects 331b, 332b, 332d, 333b, 333d, and 334b to which the power supply voltage VSS is supplied.

As for the M1 interconnects, inter-interconnect capacitances are formed between the M1 interconnects 341 and 343 to which the power supply voltage VDD is supplied and the M1 interconnects 342 and 344 to which the power supply voltage VSS is supplied.

Thus, in this embodiment, a capacitance cell capable of sufficiently securing a capacitance value can be implemented using VNW FETs.

The transistors P1 to P4 and N1 to N4 constituting the capacitance cell according to this embodiment are so-called dummy VNW FETs that do not contribute to the logical function of the circuit. By placing such dummy VNW FETs, in the resultant semiconductor integrated circuit device, the distribution of VNW FETs is made uniform, increasing the fabrication precision and also preventing or reducing variations in transistor characteristics. Also, by placing the gate interconnects 321 to 326, variations in gate pattern are prevented or reduced, increasing the fabrication precision and also preventing or reducing variations in transistor characteristics.

The gate interconnects 321, 322, 323, 324, 325, and 326 all extend in the Y direction and have the same interconnect width. This makes fabrication easy and increases the fabrication precision. The local interconnects 331a, 331b, 332a, 332b, 332c, 332d, 333a, 333b, 333c, 333d, 334a, and 334b all extend in the Y direction and have the same interconnect width. This makes fabrication easy and increases the fabrication precision. The M1 interconnects 341, 342, 343, and 344 all extend in the X direction and have the same interconnect width. This makes fabrication easy and increases the fabrication precision.

For the transistors P4 and N1, the bottoms and the gates may be omitted. Even VNWs themselves may be omitted.

In the layout structure described above, the bottom region 311 is formed integrally over the entire region of the transistors P1 to P3, and the bottom region 312 is formed integrally over the entire region of the transistors N2 to N4. Alternatively, the bottom regions 311 and 312 may be formed in separate forms. For example, the bottom region 311 may be divided for the transistors P1 to P3 to form individual regions long in the Y direction.

(Alteration of Fourth Embodiment)

Figure 23A:
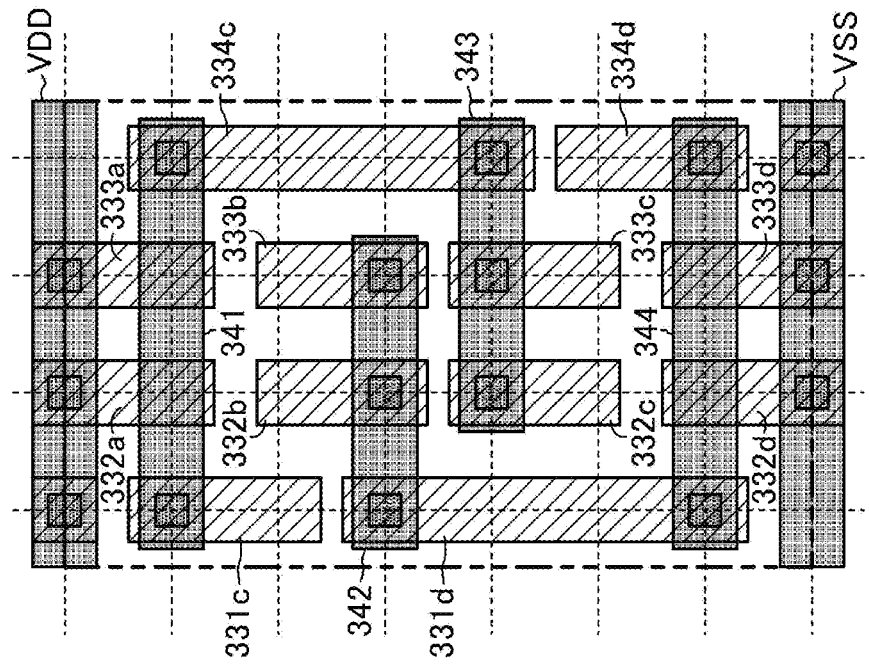
FIGS. 23A and 23B are plan views in different layers showing the layout structure of the capacitance cell according to the alteration of the fourth embodiment.
Figure 23B:
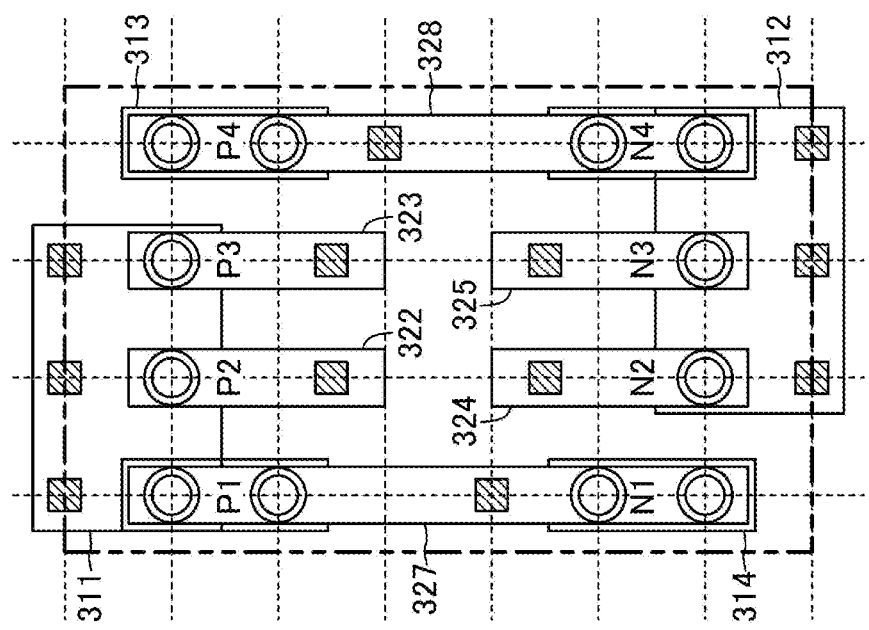

FIGS. 22 and 23A-23B are views showing an example of the layout structure of a capacitance cell according to this alteration, where FIG. 22 is a plan view and FIGS. 23A and 23B are plan views in different layers. Specifically, FIG. 23A shows VNW FETs and layers below them, and FIG. 23B shows layers above VNW FETs.

In this alteration, the transistors P1, P4, N1, and N4 each have two VNWs lying side by side in the Y direction. In the transistor P4, the bottom is connected to a bottom region 313, and the gate is connected to the gate of the transistor N4 through a gate interconnect 328. In the transistor N1, the bottom is connected to a bottom region 314, and the gate is connected to the gate of the transistor P1 through a gate interconnect 327. Note however that the gate of the transistor P4 may not be connected to the gate of the transistor N4 and the gate of the transistor N1 may not be connected to the gate of the transistor P1.

According to this alteration, since the transistors P1, P4, N1, and N4 closest to both ends of the capacitance cell in the X direction have two VNWs each, variations in shape-dependent influence can be reduced when transistors in horizontally adjacent cells have two VNWs each.

Note that, in this embodiment, a configuration in which each transistor has two VNWs lying side by side in the Y direction is also acceptable.

Other Embodiments (No. 1)
While the planar shape of the VNWs is a circle in the layout structure examples described above, it is not limited to a circle. For example, the planar shape of the VNWs can be a rectangle or an oval. When the planar shape of the VNWs is an oval, for example, the area of the VNWs per unit area will be large, so that the capacitance value of the capacitance cell can be made larger. Note that, when the VNWs have a planar shape extending long in one direction like an oval, the extension direction is preferably uniform. Also, the positions of the ends are preferably aligned.

All VNWs in one capacitance cell do not necessarily have the same shape, but VNWs having different planar shapes may be mixed in one capacitance cell.

(No. 2)
While each VNW FET is constituted by one or two VNWs in the layout structure examples described above, the number of VNWs constituting the VNW FET is not limited to this.

(No. 3)
In the layout structure examples described above, description was made taking as an example a capacitance cell having four transistors arranged in the X direction and having a cell width (size in the X direction) of four grid lines. The cell width of the capacitance cell is not limited to this. Also, at layout design, a plurality of capacitance cells different in cell width may be prepared. This will improve the degree of freedom of the layout design.

Figure 24:
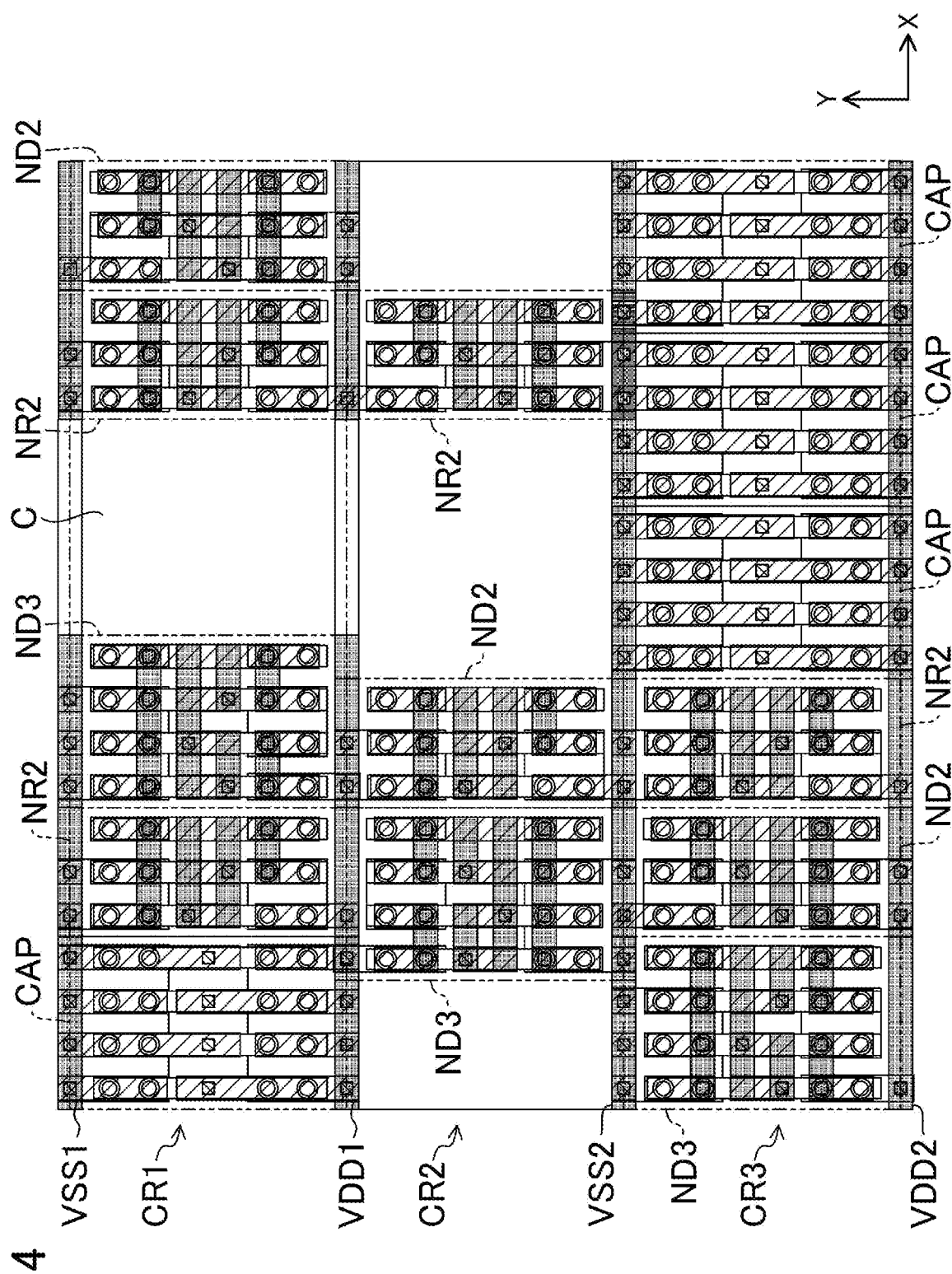
FIG. 24 is a plan view showing a layout example of a circuit block in which capacitance cells according to the present disclosure are placed.

<Block Layout Example>
FIG. 24 is a plan view showing an example of the layout of a circuit block in a semiconductor integrated circuit device using the capacitance cells according to the present disclosure. In the circuit block shown in FIG. 24, a plurality of cell rows CR1, CR2, and CR3 each having a plurality of cells C lining up in the X direction are arranged in the Y direction. Among the plurality of cells C, CAP denotes a capacitance cell, which is herein assumed to have the layout structure of the first embodiment. ND2 denotes a two-input NAND cell, NR2 a two-input NOR cell, and ND3 a three-input NAND cell, all having layout structures including VNW FETs. For other cells, illustration of detailed layout structures is omitted. Power supply interconnects VSS1, VDD1, VSS2, and VDD2 extending in the X direction are placed on both sides of the plurality of cell rows CR1, CR2, and CR3 in the Y direction. The power supply interconnects VSS1 and VSS2 supply the power supply voltage VSS, and the power supply interconnects VDD1 and VDD2 supply the power supply voltage VDD.

In the circuit block shown in FIG. 24, the plurality of cell rows CR1, CR2, and CR3 are vertically flipped alternately, so that the adjacent cell rows share the power supply interconnect lying between them. For example, the cell rows CR1 and CR2 share the power supply interconnect VDD1, and the cell rows CR2 and CR3 share the power supply interconnect VSS2.

The positions of the VNW FETs are aligned in the X direction. The positions of VNWs in the Y direction and the number of VNWs are the same through the block including the capacitance cells CAP. Also, in the cells upwardly and downwardly adjacent to the power supply interconnect VDD1 or VSS2, the spacing between adjacent VNW FETs is fixed. It is therefore possible to place the capacitance cells CAP while preventing or reducing variations in transistor performance in the cells ND2, ND3 and NR2 that achieve the circuit function.

Note that, as the capacitance cells CAP, capacitance cells having other layout structures according to the present disclosure may be placed.

According to the present disclosure, a layout structure capable of sufficiently securing a capacitance value can be achieved for a capacitance cell using VNW FETs. The present disclosure is therefore useful for improvement of the performance of a semiconductor chip, for example.

What is claimed is:

1. A semiconductor integrated circuit device including a standard cell that is a capacitance cell, wherein
the standard cell includes:
a first power supply interconnect extending in a first direction, configured to supply a first power supply voltage,
a second power supply interconnect extending in the first direction, configured to supply a second power supply voltage different from the first power supply voltage, and
a plurality of first-conductivity type vertical nanowire (VNW) FETs lining up in the first direction, provided between the first power supply interconnect and the second power supply interconnect, the plurality of first-conductivity type VNW FETs each having a gate electrode, a top electrode that is to be a source/drain electrode, and a bottom electrode that is to be a source/drain electrode, and
the plurality of first-conductivity type VNW FETs include at least one first VNW FET, wherein
the top electrode of the at least one first VNW FET is connected with the first power supply interconnect,
the bottom electrode of the at least one first VNW FET is connected with the first power supply interconnect, and
the gate electrode of the at least one first VNW FET is connected with the second power interconnect.

2. The semiconductor integrated circuit device of claim 1, comprising:
a bottom region connected with the bottom electrode of the first VNW FET;
a local interconnect connected with the top electrode of the first VNW FET; and
a gate interconnect connected with the gate electrode of the first VNW FET, wherein in a region of the first VNW FET, the bottom region, the local interconnect, and the gate interconnect overlap one another as viewed from top.

3. The semiconductor integrated circuit device of claim 1, wherein the plurality of first-conductivity type VNW FETs include:
  two first VNW FETs as the at least one first VNW FET, and
  a second VNW FET placed between the first VNW FETs, wherein
  the top electrode of the second VNW FET is connected with the first power supply interconnect,
  the bottom electrode of the second VNW FET is connected with the first power supply interconnect, and
  the gate electrode of the second VNW FET is connected with the first power interconnect.

4. The semiconductor integrated circuit device of claim 1, wherein the plurality of first-conductivity type VNW FETs include:
  two first VNW FETs as the at least one first VNW FET, and
  a second VNW FET placed between the first VNW FETs, wherein
  the gate electrode of the second VNW FET is connected with the first power interconnect, and
  the top electrode of the second VNW FET is connected with the second power supply interconnect.

5. The semiconductor integrated circuit device of claim 3, wherein gate interconnects connected to the gate electrodes of the first VNW FETs and a gate interconnect connected to the gate electrode of the second VNW FET are formed in parallel to extend in a second direction perpendicular to the first direction.

6. A semiconductor integrated circuit device including a standard cell that is a capacitance cell, wherein
  the standard cell includes:
    a first power supply interconnect extending in a first direction, configured to supply a first power supply voltage,
    a second power supply interconnect extending in the first direction, configured to supply a second power supply voltage different from the first power supply voltage,
    a first capacitance part having a plurality of first-conductivity type vertical nanowire (VNW) FETs lining up in the first direction, provided between the first power supply interconnect and the second power supply interconnect, the plurality of first-conductivity type VNW FETs each having a gate electrode, a top electrode that is to be a source/drain electrode, and a bottom electrode that is to be a source/drain electrode, and
    a fixed value output part having a second-conductivity type VNW FET provided between the first power supply interconnect and the second power supply interconnect, configured to supply the second power supply voltage to the first capacitance part, the second-conductivity type VNW FET having a gate electrode, a top electrode that is to be a source/drain electrode, and a bottom electrode that is to be a source/drain electrode, and
  the plurality of first-conductivity type VNW FETs of the first capacitance part include at least one first VNW FET, wherein
  the top electrode of the at least one first VNW FET is connected with the first power supply interconnect,
  the bottom electrode of the at least one first VNW FET is connected with the first power supply interconnect, and
  the gate electrode of the at least one first VNW FET is connected with the top of the second-conductivity type VNW FET of the fixed value output part.

7. The semiconductor integrated circuit device of claim 6, comprising:
  a bottom region connected with the bottom electrode of the first VNW FET;
  a local interconnect connected with the top electrode of the first VNW FET; and
  a gate interconnect connected with the gate electrode of the first VNW FET,
  wherein in a region of the first VNW FET, the bottom region, the local interconnect, and the gate interconnect overlap one another as viewed from top.

8. The semiconductor integrated circuit device of claim 6, wherein
  the standard cell further includes:
    a second capacitance part having a plurality of second-conductivity type vertical nanowire (VNW) FETs lining up in the first direction, provided between the first power supply interconnect and the second power supply interconnect, the plurality of second-conductivity type VNW FETs each having a gate electrode, a top electrode that is to be a source/drain electrode, and a bottom electrode that is to be a source/drain electrode,
  the fixed value output part has a first-conductivity type VNW FET provided between the first power supply interconnect and the second power supply interconnect and supplies the first power supply voltage to the second capacitance part, the first-conductivity type VNW FET having a gate electrode, a top electrode that is to be a source/drain electrode, and a bottom electrode that is to be a source/drain electrode, and
  the plurality of second-conductivity type VNW FETs of the second capacitance part include at least one second VNW FET, wherein
  the top electrode of the at least one second VNW FET is connected with the second power supply interconnect,
  the bottom electrode of the at least one second VNW FET is connected with the second power supply interconnect, and
  the gate electrode of the at least one second VNW FET is connected with the top of the first conductivity type VNW FET of the fixed value output part.

9. The semiconductor integrated circuit device of claim 8, comprising:
  a bottom region connected with the bottom electrode of the second VNW FET;
  a local interconnect connected with the top electrode of the second VNW FET; and
  a gate interconnect connected with the gate electrode of the second VNW FET,
  wherein in a region of the second VNW FET, the bottom region, the local interconnect, and the gate interconnect overlap one another as viewed from top.

10. The semiconductor integrated circuit device of claim 8, wherein
  the first-conductivity type VNW FET of the fixed value output part is placed to line up with the plurality of first-conductivity type VNW FETs of the first capacitance part in the first direction, and
  the second-conductivity type VNW FET of the fixed value output part is placed to line up with the plurality of second-conductivity type VNW FETs of the second capacitance part in the first direction.

11. The semiconductor integrated circuit device of claim 4, wherein gate interconnects connected to the gate electrodes of the first VNW FETs and a gate interconnect connected to the gate electrode of the second VNW FET are formed in parallel to extend in a second direction perpendicular to the first direction.

* * * * *